United States Patent
Yokomizo

(10) Patent No.: US 11,622,449 B2
(45) Date of Patent: Apr. 4, 2023

(54) MULTILAYER CERAMIC CAPACITOR

(71) Applicant: Murata Manufacturing Co., Ltd., Nagaokakyo (JP)

(72) Inventor: Satoshi Yokomizo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 94 days.

(21) Appl. No.: 17/236,025

(22) Filed: Apr. 21, 2021

(65) Prior Publication Data

US 2021/0337669 A1 Oct. 28, 2021

(30) Foreign Application Priority Data

Apr. 24, 2020 (JP) .............................. JP2020-077297

(51) Int. Cl.
| | |
|---|---|
| *H05K 1/18* | (2006.01) |
| *H01G 4/232* | (2006.01) |
| *H05K 1/14* | (2006.01) |
| *H05K 1/11* | (2006.01) |

(Continued)

(52) U.S. Cl.
CPC ............. *H05K 1/181* (2013.01); *H01G 4/232* (2013.01); *H05K 1/112* (2013.01); *H05K 1/141* (2013.01); *H01G 4/1227* (2013.01); *H01G 4/30* (2013.01); *H05K 2201/049* (2013.01); *H05K 2201/09672* (2013.01); *H05K 2201/10015* (2013.01); *H05K 2201/10378* (2013.01)

(58) Field of Classification Search
CPC ...................................... H05K 1/181
USPC ......................................... 174/260
See application file for complete search history.

(56) References Cited

U.S. PATENT DOCUMENTS

| | | | | |
|---|---|---|---|---|
| 9,686,855 | B2* | 6/2017 | Ishikawa | H05K 1/113 |
| 10,553,360 | B2* | 2/2020 | Kitano | H01G 4/012 |

(Continued)

FOREIGN PATENT DOCUMENTS

| | | |
|---|---|---|
| CN | 104995703 A | 10/2015 |
| JP | 2015-023209 A | 2/2015 |

OTHER PUBLICATIONS

First Office Action in CN202110433146.5, dated Jun. 24, 2022, 6 pages.

*Primary Examiner* — Stanley Tso
(74) *Attorney, Agent, or Firm* — Keating & Bennett, LLP

(57) ABSTRACT

In a multilayer ceramic capacitor, an interposer includes, on a side of a first external electrode in a length direction, a first through hole that penetrates the interposer in a stacking direction, and provides electrical conduction between a first joining electrode and a first mounting electrode. The first through hole further includes a first metal film provided on an inner wall thereof. The interposer includes, on a side of a second external electrode in the length direction, a second through hole that penetrates the interposer in the stacking direction, and provides electrical conduction between a second joining electrode and a second mounting electrode. The second through hole further includes a second metal film provided on an inner wall thereof. A first uncovered portion is provided, which is not covered by the first metal film, on a first surface of the inner wall of the first through hole, and a second uncovered portion is provided which is not covered by a second metal film on the first surface of the inner wall of the second through hole.

20 Claims, 16 Drawing Sheets

(51) Int. Cl.
 *H01G 4/12* (2006.01)
 *H01G 4/30* (2006.01)

(56) References Cited

U.S. PATENT DOCUMENTS

| | | |
|---|---|---|
| 2001/0002624 A1* | 6/2001 | Khandros .............. H05K 3/308 |
| | | 257/E21.507 |
| 2015/0114705 A1* | 4/2015 | Ahn ........................ H01G 4/30 |
| | | 361/301.4 |
| 2016/0007446 A1 | 1/2016 | Ishikawa et al. |
| 2018/0158612 A1* | 6/2018 | Imura ................... C04B 35/475 |

* cited by examiner

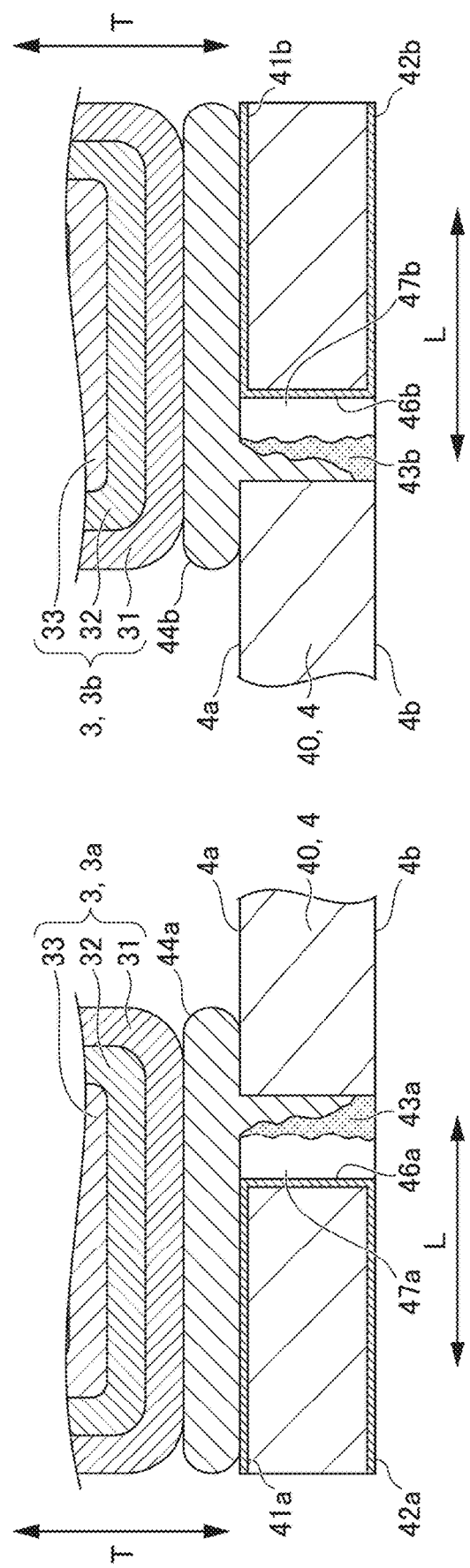

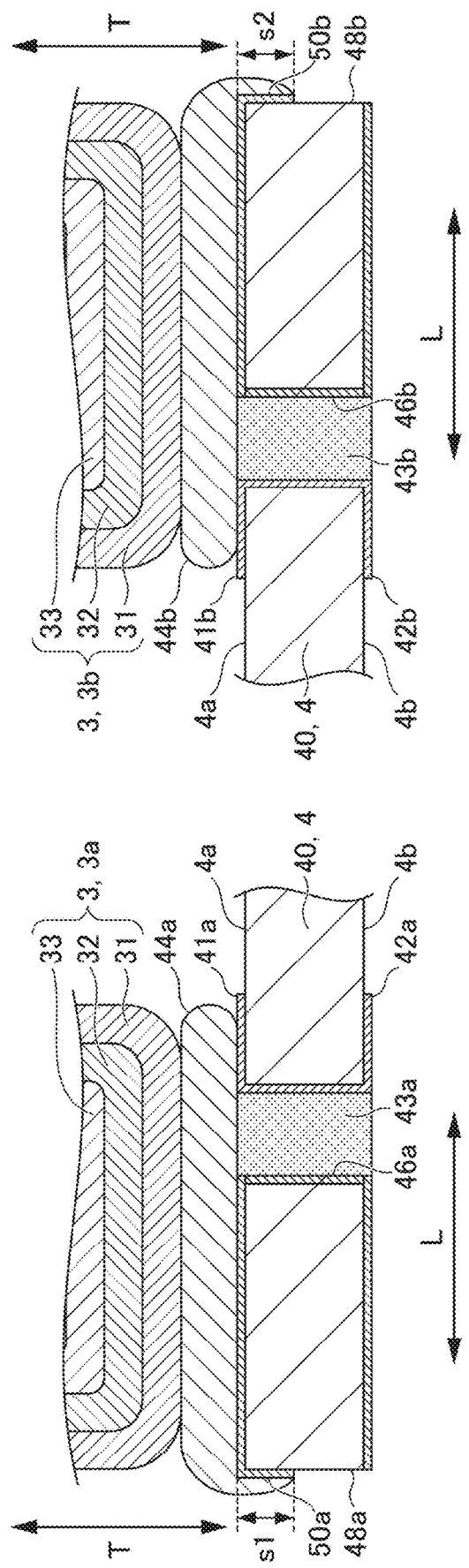

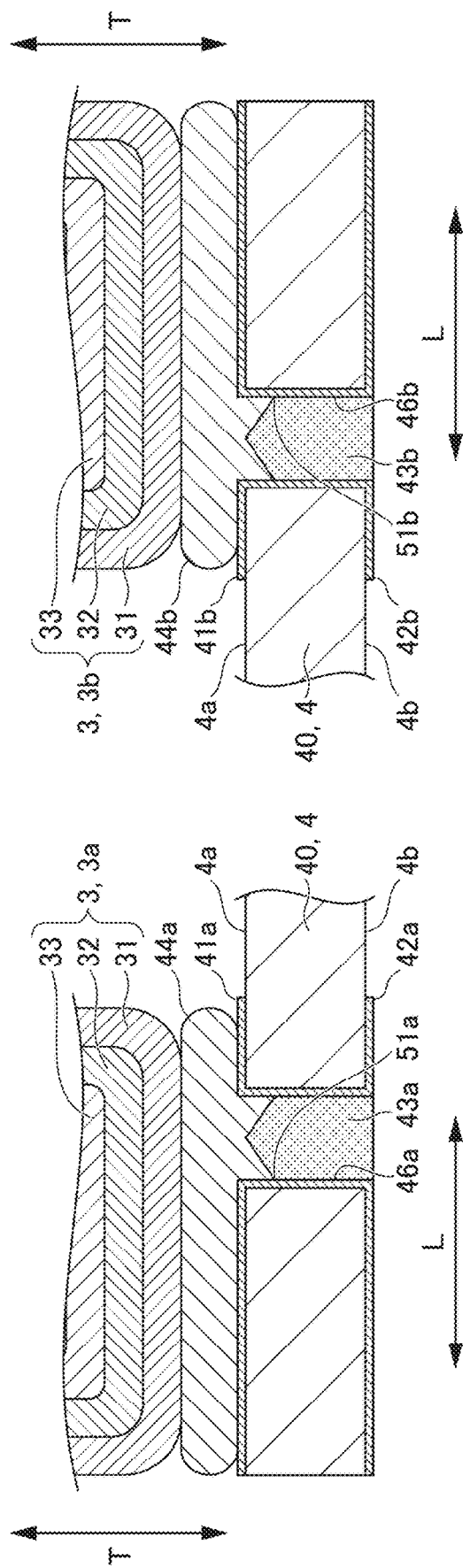

MULTILAYER CERAMIC CAPACITOR

CROSS REFERENCE TO RELATED APPLICATIONS

This application claims the benefit of priority to Japanese Patent Application No. 2020-077297 filed on Apr. 24, 2020. The entire contents of this application are hereby incorporated herein by reference.

BACKGROUND OF THE INVENTION

1. Field of the Invention

The present invention relates to a multilayer ceramic capacitor.

2. Description of the Related Art

Recently, a large-capacitance and small-size multilayer ceramic capacitor has been demanded. Such a multilayer ceramic capacitor includes an inner layer portion in which dielectric layers made of a ferroelectric material having relatively high dielectric constant and internal electrodes are alternately stacked. Furthermore, dielectric layers as outer layer portions are provided on and below the inner layer portion, thus forming a rectangular multilayer main body. Side gap portions are provided on both side surfaces of the multilayer main body in the width direction, thus forming a multilayer body. External electrodes are provided on both end surfaces of the multilayer body in the longitudinal direction, thus forming a capacitor main body.

Furthermore, in order to suppress the generation of so-called "acoustic noise", a multilayer ceramic capacitor is known which includes an interposer provided on the side of the capacitor main body on which a substrate is mounted.

In the interposer, a through hole is sometimes provided which provides electrical conduction between the external electrodes and the substrate. Furthermore, solder is used for joining a capacitor main body and the interposer. When the solder flows in this through hole, the through hole is filled with the solder. Meanwhile, the solder is also used when mounting the multilayer ceramic capacitor to the substrate. At this time, if the through hole is filled with the solder, the solder for mounting cannot flow in the through hole, and thus the posture at the time of mounting is not stable.

For this reason, prior art has been known which covers an upper portion of a through hole with a solder-non-adhering film, thus preventing solder from flowing in the through hole when joining a capacitor main body and an interposer and preventing the through hole from being filled with the solder (refer to Japanese Unexamined Patent Application, Publication No. 2015-23209).

SUMMARY OF THE INVENTION

However, according to the above prior art, it is necessary to further perform a step of covering the upper portion of the through hole with a solder non-adhering film.

Preferred embodiments of the present invention provide multilayer ceramic capacitors each capable of stabilizing a posture upon mounting by providing a gap more easily in a through hole in an interposer.

A preferred embodiment of the present invention provides a multilayer ceramic capacitor including a capacitor main body; and an interposer, the capacitor main body including a multilayer body including dielectric layers and internal electrode layers alternately stacked, a first main surface on one side and a second main surface on the other side in a stacking direction, and a first end surface on one side and a second end surface on the other side in a length direction intersecting the stacking direction, a first external electrode provided on the first end surface of the multilayer body and extending from the first end surface to a portion of the first main surface and a portion of the second main surface, and a second external electrode provided on the second end surface of the multilayer body and extending from the second end surface to a portion of the first main surface and a portion of the second main surface, the interposer being provided at or adjacent to the second main surface of the capacitor main body, and including a first surface facing the second main surface, and a second surface opposite to the first surface, in which the interposer includes, on a side of the first external electrode in the length direction, a first joining electrode on the first surface, a first mounting electrode on the second surface, and a first through hole that penetrates the interposer in the stacking direction, and provides electrical conduction between the first joining electrode and the first mounting electrode, the first through hole further including a first metal film provided on an inner wall thereof, and includes, on a side of the second external electrode in the length direction, a second joining electrode on the first surface, a second mounting electrode on the second surface, a second through hole that penetrates the interposer in the stacking direction, and provides electrical conduction between the second joining electrode and the second mounting electrode, the second through hole further including a second metal film provided on an inner wall thereof, a first uncovered portion is provided, which is not covered by the first metal film, on the first surface of the inner wall of the first through hole, and a second uncovered portion is provided which is not covered by the second metal film on the first surface of the inner wall of the second through hole.

According to preferred embodiments of the present invention, it is possible to provide multilayer ceramic capacitors each capable of stabilizing posture upon mounting by providing a gap more easily in a through hole in an interposer.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A to 6C provide enlarged views of a portion of the multilayer ceramic capacitor surrounded by a circle shown in FIG. 2 in the first preferred embodiment in which FIG. 6A illustrates the first preferred embodiment, and FIGS. 6B and 6C illustrate modifications of the first preferred embodiment of the present invention.

FIGS. 11A and 11B provide partially enlarged views of a multilayer ceramic capacitor in a second preferred embodiment of the present invention in which FIG. 11A is one portion in the length direction, and FIG. 11B is the other portion in the length direction.

FIGS. 12A and 12B provide partially enlarged views of the multilayer ceramic capacitor in a modification of the second preferred embodiment of the present invention in which FIG. 12A is one portion in the length direction, and FIG. 12B is the other portion in the length direction.

FIGS. 14A and 14B provide partially enlarged views of a state in which a multilayer ceramic capacitor of a third preferred embodiment of the present invention is mounted on a substrate in which FIG. 14A is one portion in the length direction, and FIG. 14B is the other portion in the length direction.

FIGS. 15A and 15B provide partially enlarged views of a multilayer ceramic capacitor of a fourth preferred embodiment of the present invention in which FIG. 15A is one portion in the length direction, and FIG. 15B is the other portion in the length direction.

FIGS. 16A and 16B provide partially enlarged views of a multilayer ceramic capacitor of a fifth preferred embodiment of the present invention in which FIG. 16A is one portion in the length direction, and FIG. 16B is the other portion in the length direction.

DETAILED DESCRIPTION OF THE PREFERRED EMBODIMENTS

First Preferred Embodiment

First, a multilayer ceramic capacitor 1 according to a first preferred embodiment of the present invention will be described.

Figure 1:
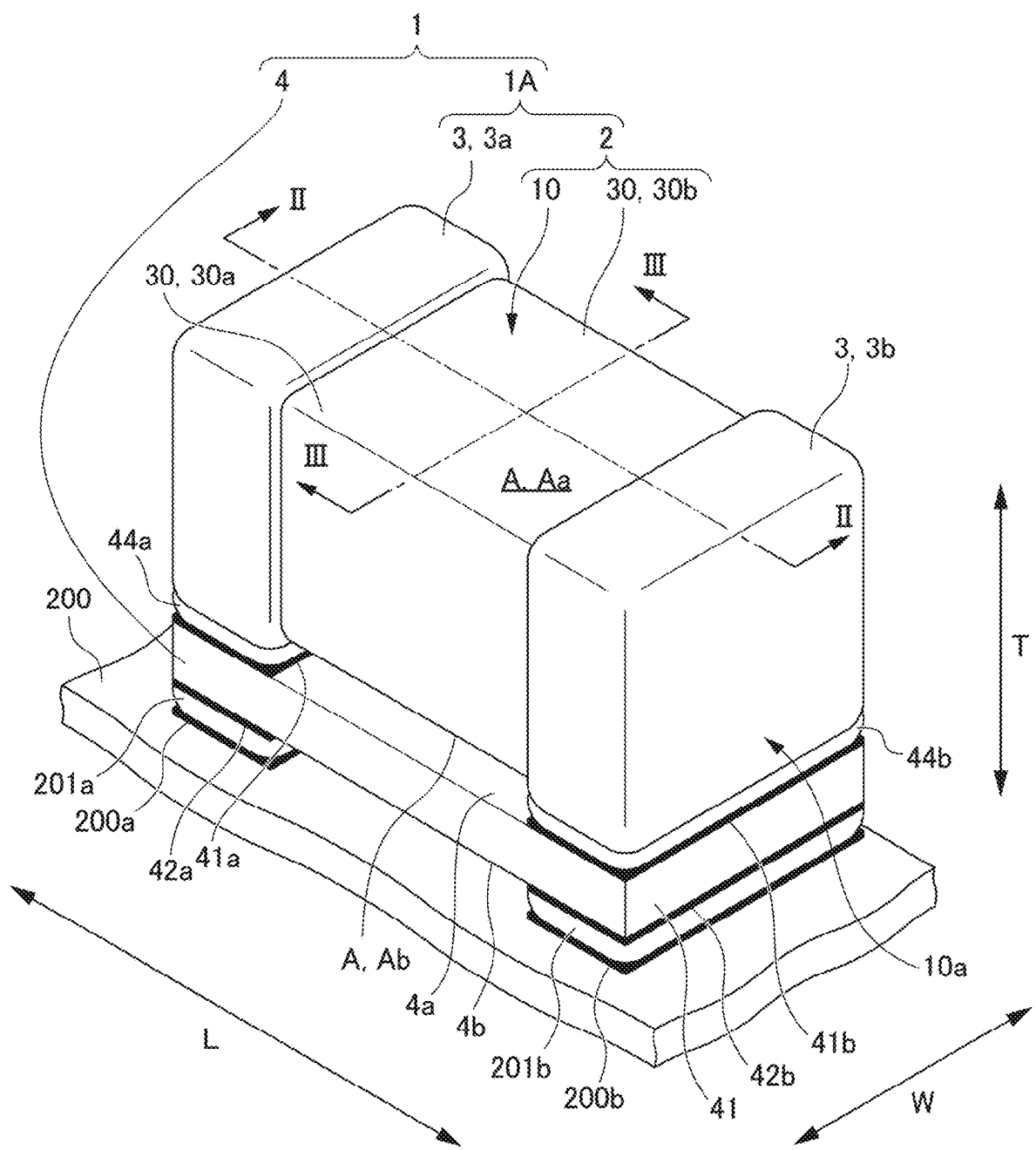
FIG. 1 is a schematic perspective view of a state in which a multilayer ceramic capacitor of a first preferred embodiment of the present invention is mounted on a substrate.
Figure 2:
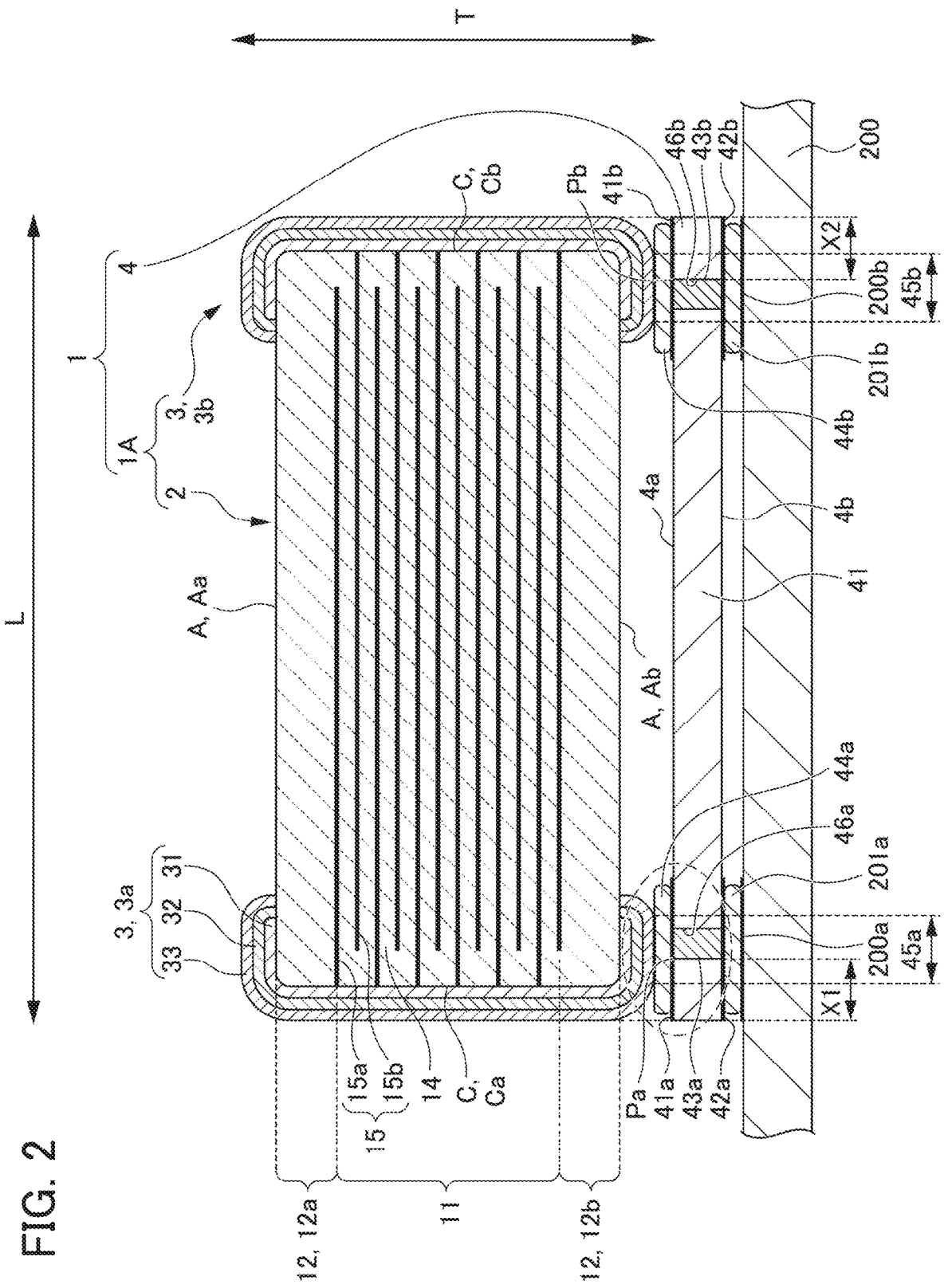
FIG. 2 is a cross-sectional view taken along the line II-II in FIG. 1 of the multilayer ceramic capacitor of the first preferred embodiment of the present invention.
Figure 3:
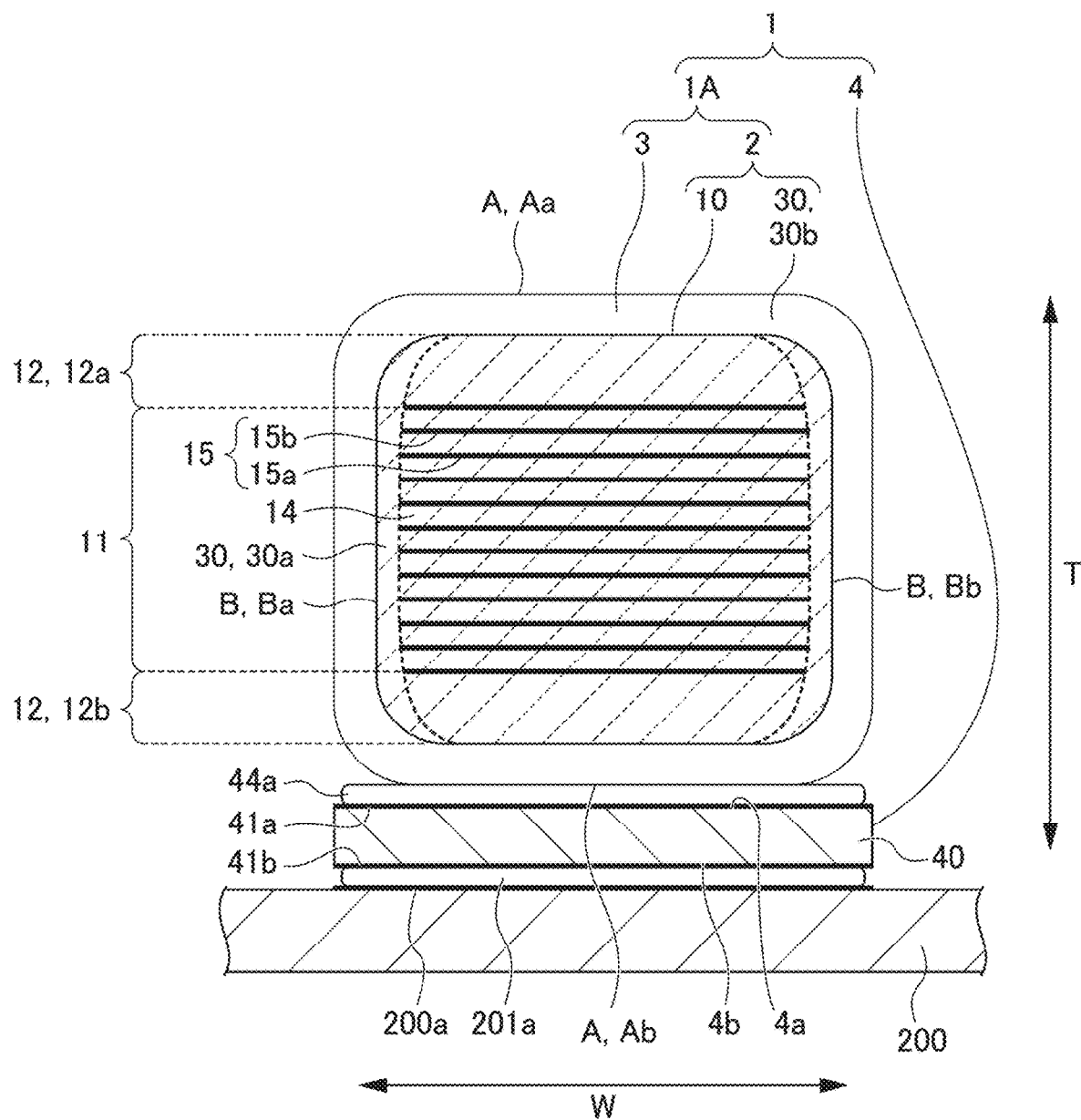
FIG. 3 is a cross-sectional view taken along the line III-III in FIG. 1 of the multilayer ceramic capacitor of the first preferred embodiment of the present invention.

FIG. 1 is a schematic perspective view of a state in which the multilayer ceramic capacitor 1 of the first preferred embodiment is mounted on a substrate 200. FIG. 2 is a cross-sectional view taken along the line II-II in FIG. 1 of the multilayer ceramic capacitor 1 of the first preferred embodiment. FIG. 3 is a cross-sectional view taken along the line III-III in FIG. 1 of the multilayer ceramic capacitor 1 of the first preferred embodiment.

The multilayer ceramic capacitor 1 has a substantially rectangular shape, and includes a capacitor main body 1A including a multilayer body 2 and a pair of external electrodes 3 provided at both ends of the multilayer body 2, and an interposer 4 affixed to the capacitor main body 1A. Furthermore, the multilayer body 2 includes an inner layer portion 11 including a plurality of sets of a dielectric layer 14 and an internal electrode layer 15.

In the following description, as a term representing the orientation of the multilayer ceramic capacitor 1, the direction in which the pair of external electrodes 3 are provided in the multilayer ceramic capacitor 1 is defined as the length direction L. The direction in which the dielectric layers 14 and the internal electrode layers 15 are stacked (or laminated) is defined as the stacking direction T. The direction intersecting both the length direction L and the stacking direction T is defined as the width direction W. It should be noted that, in the preferred embodiments, the width direction W is orthogonal to both of the length direction L and the stacking direction T.

Figure 4:
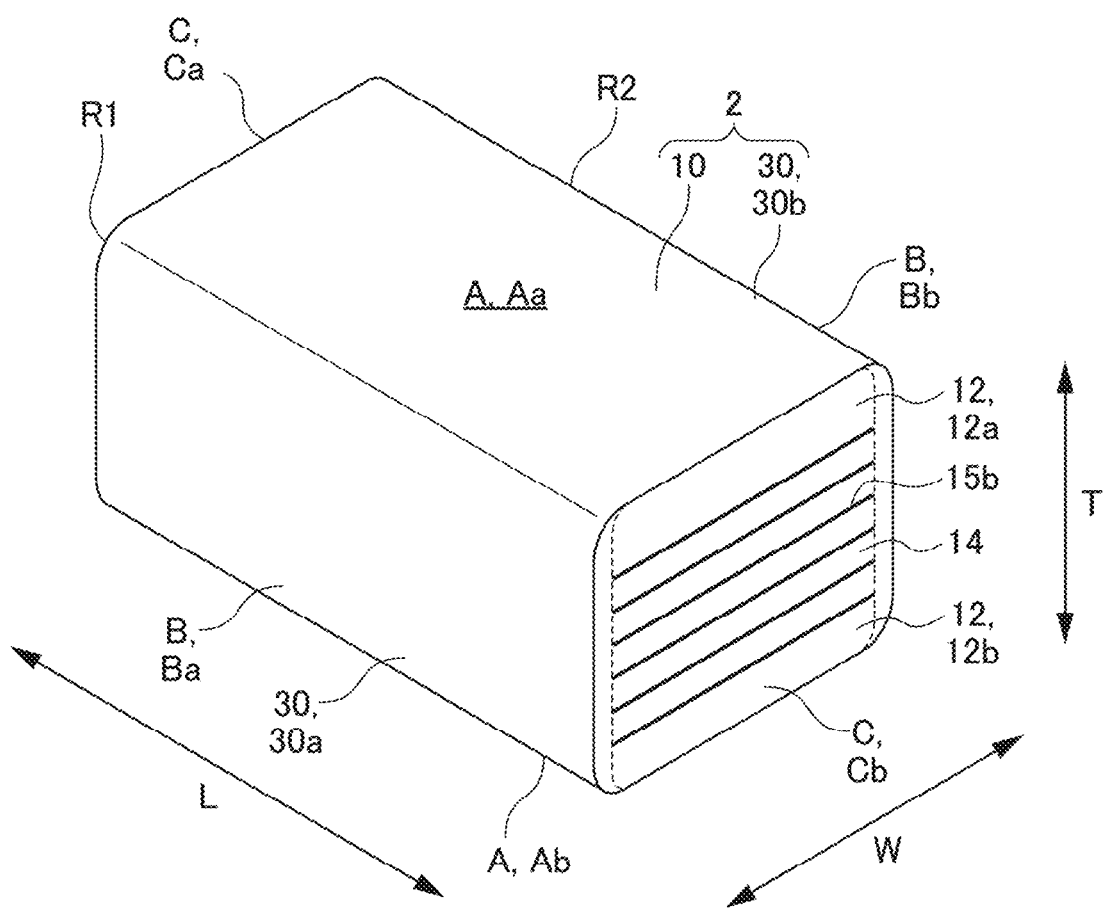
FIG. 4 is a schematic perspective view of a multilayer body of the multilayer ceramic capacitor of the first preferred embodiment of the present invention.
Figure 5:
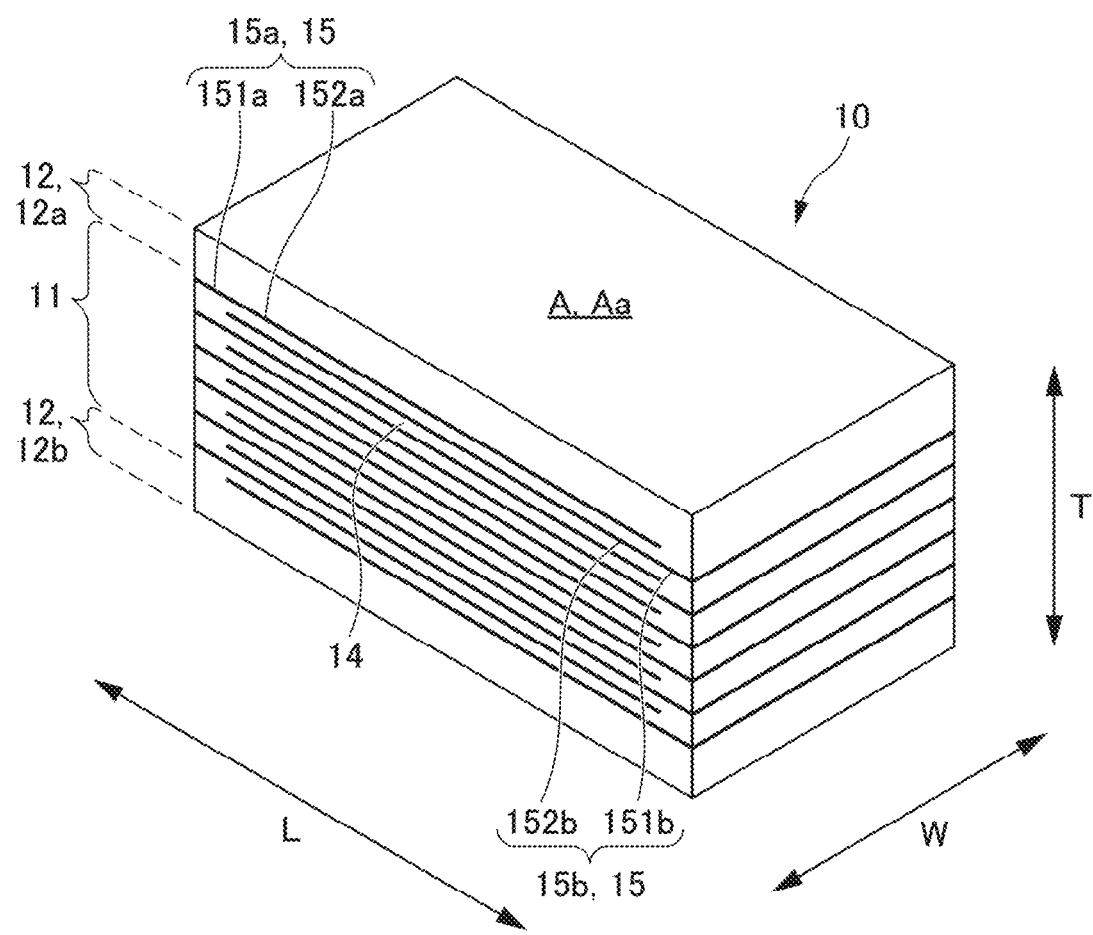
FIG. 5 is a schematic perspective view of a multilayer main body of the multilayer ceramic capacitor of the first preferred embodiment of the present invention.

FIG. 4 is a schematic perspective view of the multilayer body 2. The multilayer body 2 includes a multilayer main body 10, and a side gap portion 30. FIG. 5 is a schematic perspective view of the multilayer main body 10.

In the following description, among the six outer surfaces of the multilayer body 2 shown in FIG. 4, a pair of outer surfaces on opposite sides in the stacking direction T are respectively defined as a first main surface Aa and a second main surface Ab, a pair of outer surfaces on opposite sides in the width direction W are respectively defined as a first side surface Ba and a second side surface Bb, and a pair of outer surfaces on opposite sides in the length direction L are respectively defined as a first end surface Ca and a second end surface Cb.

It should be noted that, in a case in which it is not necessary to specifically distinguish the first main surface Aa and the second main surface Ab from each other, they will be collectively described as the main surface A, in a case in which it is not necessary to specifically distinguish the first side surface Ba and the second side surface Bb from each other, they will be collectively described as the side surface B, and in a case in which it is not necessary to specifically distinguish the first end surface Ca and the second end surface Cb from each other, they will be collectively described as the end surface C.

The multilayer body 2 is preferably rounded at a corner R1 and a ridge R2. The corner R1 is a portion where the main surface A, the side surface B, and the end surface C intersect. The ridge R2 is a portion where two surfaces of the multilayer body 2, i.e., the main surface A and the side surface B, the main surface A and the end surface C, or the side surface B and the end surface C intersect.

In addition, surface irregularities and the like may be formed on a portion or all of the main surface A, the side surface B, and the end surface C of the multilayer body 2. The dimension of the multilayer body 2 is not particularly limited; however, it is preferable that the dimension in the length direction L is about 0.2 mm or more and about 10 mm or less, the dimension in the width direction W is about 0.1 mm or more and about 10 mm or less, and the dimension in the stacking direction T is about 0.1 mm or more and about 5 mm or less, for example.

As shown in FIG. 5, the multilayer main body 10 includes the inner layer portion 11, an upper outer layer portion 12a disposed at or adjacent to the first main surface Aa of the inner layer portion 11, and a lower outer layer portion 12b disposed at or adjacent to the second main surface Ab of the inner layer portion 11.

The inner layer portion 11 includes the plurality of sets of dielectric layer 14 and the internal electrode layer 15 which are alternately stacked along the stacking direction T.

The dielectric layer 14 has a thickness of about 0.5 μm or less. The dielectric layer 14 is made of a ceramic material. As the ceramic material, for example, a dielectric ceramic including $BaTiO_3$ as a main component is used. Furthermore, a ceramic material obtained by adding at least one of sub-components such as Mn compounds, Fe compounds, Cr compounds, Co compounds, and Ni compounds to these main components may be used. It should be noted that the number of dielectric layers 14 including the multilayer main body 10 including the upper outer layer portion 12a and the lower outer layer portion 12b is preferably fifteen sheets or more and 700 sheets or less.

The internal electrode layer 15 includes a plurality of first internal electrode layers 15a and a plurality of second internal electrode layers 15b. The first internal electrode layers 15a and the second internal electrode layers 15b are alternately arranged. It should be noted that, when it is not necessary to distinguish the first internal electrode layer 15a from the second internal electrode layer 15b, they will be collectively described as the internal electrode layer 15.

The first internal electrode layer 15a includes a first opposing portion 152a provided opposite to the second internal electrode layer 15b, and a first lead-out portion 151a extending from the first opposing portion 152a to the side of the first end surface Ca. An end of the first lead-out portion 151a is exposed on the first end surface Ca and is electrically connected to a first external electrode 3a to be described later.

The second internal electrode layer 15b includes a second opposing portion 152b provided opposite to the first internal electrode layer 15a, and a second lead-out portion 151b extending from the second opposing portion 152b to the second end surface Cb. An end of the second lead-out portion 151b is electrically connected to a second external electrode 3b to be described later.

Charge is accumulated in the first opposing portion 152a of the first internal electrode layer 15a and the second opposing portion 152b of the second internal electrode layer 15b, such that the characteristics of the capacitor are developed.

The internal electrode layer 15 is preferably made of a metallic material such as Ni, Cu, Ag, Pd, or Au, or Ag—Pd alloy, for example. The thickness of the internal electrode layer 15 is preferably about 0.5 μm or more and about 2.0 μm, for example. The number of the internal electrode layers 15 is preferably fifteen or more and 200 or less in total of the first internal electrode layer 15a and the second internal electrode layer 15b.

The outer layer portion 12 is made of the same material as the dielectric layer 14 of the inner layer portion 11. Furthermore, the thickness of the outer layer portion 12 is, for example, about 20 μm or less, and preferably about 10 μm or less.

The side gap portion 30 includes a first side gap portion 30a provided at or adjacent to the first side surface Ba of the multilayer main body 10 and a second side gap portion 30b provided at or adjacent to the second side surface Bb of the multilayer main body 10.

It should be noted that, in a case in which it is not necessary to specifically distinguish the first side gap portion 30a and the second side gap portion 30b from each other, they will be collectively described as the side gap portion 30.

The side gap portion 30 covers the end on the side in the width direction W of the internal electrode layer 15 which is exposed on both sides of the multilayer main body 10 along its end. The side gap portion 30 is made of the same material as the dielectric layer 14, and further includes Mg as a sintering aid. Mg migrates to the side of the internal electrode layer 15 side during sintering of the side gap portion 30, such that Mg is segregated on the side of the side gap portion 30 in contact with the internal electrode layer 15. Furthermore, an interface is present between the multilayer main body 10 and the side gap portion 30.

The thickness of the side gap portion 30 is, for example, about 20 μm or less, and preferably about 10 μm or less.

Furthermore, although the side gap portion 30 is a single layer in the present preferred embodiment, the present invention is not limited thereto, and the side gap portion 30 may have a two-layer structure of an outer side gap layer located on the outside and an inner side gap layer located on the side of the internal electrode layer 15.

In this case, it is preferable that the content of Si in the outer side gap layer be larger than that in the inner side gap layer. With such a configuration, it is possible to improve the strength of the side gap portion 30, thus improving the bending strength of the multilayer ceramic capacitor 1. Furthermore, since cracks or chipping hardly occur in the side gap portion 30 and thus it is possible to prevent the intrusion of moisture, it is possible to ensure the insulating property of the multilayer ceramic capacitor 1. As a result, it is possible to provide the multilayer ceramic capacitor 1 with improved reliability. Furthermore, the interface is present between the outer side gap layer and the inner side gap layer. This interface makes it possible to alleviate the stress acting on the multilayer ceramic capacitor 1.

The external electrode 3 includes a first external electrode 3a provided on the first end surface Ca of the multilayer body 2, and a second external electrode 3b provided on the second end surface Cb of the multilayer body 2. It should be noted that, in a case in which it is not necessary to specifically distinguish between the first external electrode 3a and the second external electrode 3b, they will be collectively described as an external electrode 3. The external electrode 3 covers not only the end surface C, but also a portion of each of the main surface A and the side surface B at or adjacent to the end surface C.

As described above, the end of the first lead-out portion 151a of the first internal electrode layer 15a is exposed at the first end surface Ca and electrically connected to the first external electrode 3a. Furthermore, the end of the second lead-out portion 151b of the second internal electrode layer 15b is exposed to the second end surface Cb, and is electrically connected to the second external electrode 3b. This provides a structure in which a plurality of capacitor elements are electrically connected in parallel between the first external electrode 3a and the second external electrode 3b.

Furthermore, as shown in FIG. 2, the external electrode includes a three-layer structure including a foundation electrode layer 31, a conductive resin layer 32 provided on the foundation electrode layer 31, and a plated layer 33 provided on the conductive resin layer 32.

It should be noted that the external electrodes 3 include a three-layer structure in the present preferred embodiment; however, the present invention is not limited thereto, and may include a two-layer structure or the like, other than the three-layer structure, for example.

The foundation electrode layer 31 is provided, for example, by applying and firing a conductive paste including a conductive metal and glass. As the conductive metal of the foundation electrode layer 31, for example, Cu, Ni, Ag, Pd, Ag—Pd alloy, Au or the like can be used.

The conductive resin layer 32 is provided so as to cover the foundation electrode layer 31. The conductive resin layer 32 has any configuration including a thermosetting resin and a metal component. As specific examples of the thermosetting resin, various known thermosetting resins such as epoxy resin, phenolic resin, urethane resin, silicone resin, polyimide resin, and the like can be used. As the metal component, for example, Ag or a metal powder coated with Ag on the surface of the base metal powder can be used.

The plated layer 33 preferably includes plating of one metal or an alloy including the metal selected from the group consisting of, for example, Cu, Ni, Su, Ag, Pd, Ag—Pd alloy, Au, or the like.

Thus, since the conductive resin layer 32 includes a thermosetting resin, for example, the conductive resin layer 32 is more flexible than the foundation electrode layer 31 made of a plated film or a fired product of a conductive paste. Therefore, even when an impact caused by physical shock or thermal cycling to the multilayer ceramic capacitor 1 is applied, the conductive resin layer 32 defines and functions as a buffer layer, such that the generation of cracks in the multilayer ceramic capacitor 1 is prevented, piezoelectric vibration is easily absorbed, and an effect of reducing or preventing the "acoustic noise" is exhibited.

Figure 6A:
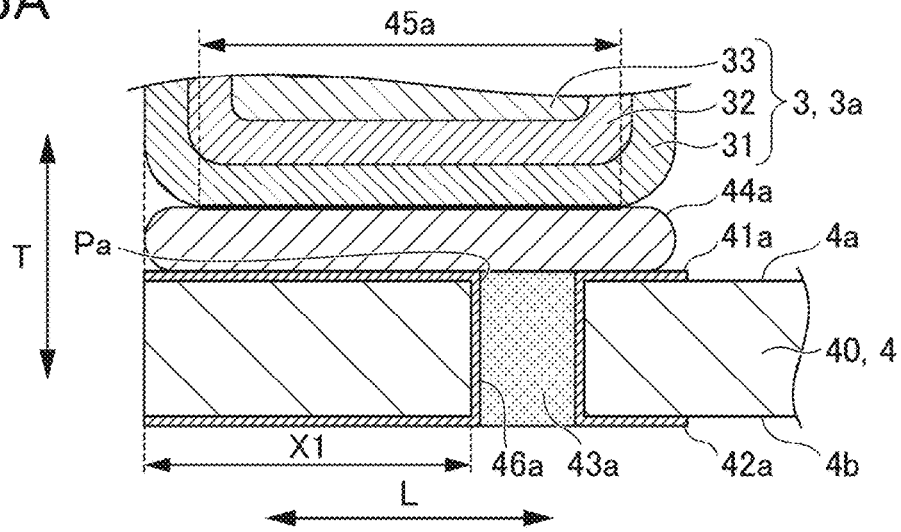
Figure 6B:
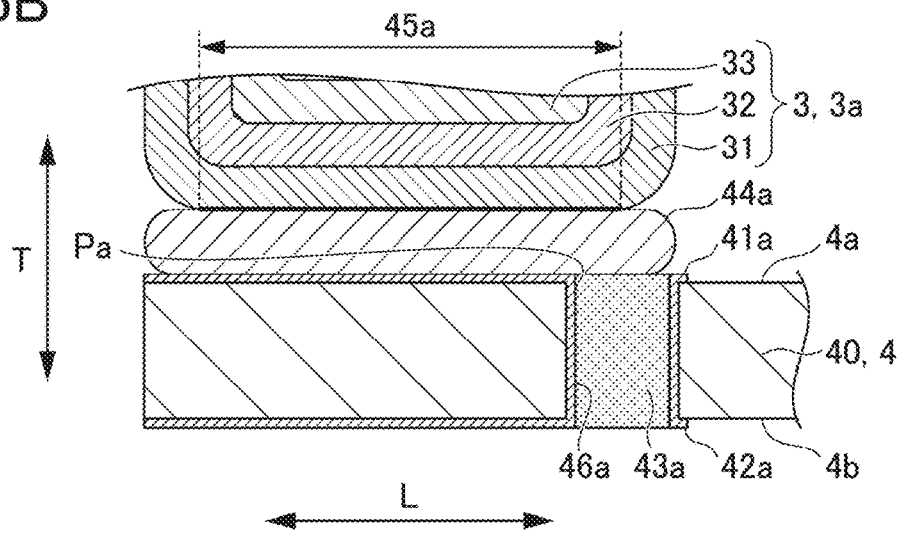
Figure 6C:
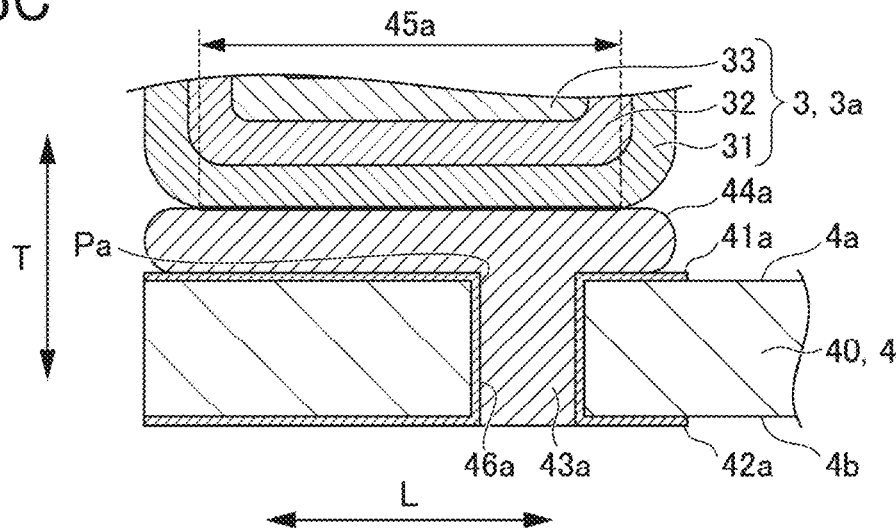

FIGS. 6A to 6C provide enlarged views of the multilayer ceramic capacitor 1 surrounded by a circle shown in FIG. 2 in the first preferred embodiment in which FIG. 6A illustrates the first preferred embodiment, and FIGS. 6B and 6C illustrate modifications of the first preferred embodiment. It should be noted that FIGS. 6A to 6C are enlarged views on the left side of FIG. 2, which is one portion on the left side in the length direction L. Since the configuration on the right side of FIG. 2, which is one portion on the right side in the length direction L, is substantially the same as the portion on the left side except for its symmetry, they are only shown in FIG. 2.

The interposer 4 includes a plate-shaped interposer main body 40. The interposer main body 40 is made of a single plate including insulating resin as a main material component. The interposer main body 40 is in a substantially rectangular shape having substantially the same size as the capacitor main body 1A in a plan view.

The interposer main body 40 is provided on the side of the second main surface Ab of the capacitor main body 1A, and includes a first surface 4a facing the second main surface Ab, and a second surface 4b opposite to the first surface 4a. As shown in FIGS. 1, 2, 3, and 6, when assuming that the side of the first main surface Aa in the stacking direction T is an upper side and the side of the second main surface Ab is a lower side, the first surface 4a as the upper surface is located on the side of the second main surface Ab of the capacitor main body, and the second surface 4b as the lower surface is affixed to the substrate 200 on which the multilayer ceramic capacitor 1 is mounted.

A first joining electrode 41a is provided on the first surface 4a on the side of the first external electrode 3a in the length direction L of the interposer main body 40. A first mounting electrode 42a is provided on the side of the second surface 4b of the interposer main body 40. A first through conductive portion 43a is provided which penetrates the interposer main body 40 in the stacking direction T and provides electric conduction between the first joining electrode 41a and the first mounting electrode 42a. Furthermore, the first external electrode 3a and the first joining electrode 41a are joined with each other in an electrically conductive manner by a first electrically conductive joining agent 44a which is, for example, solder for joining.

A second joining electrode 41b is provided on the first surface 4a on the side of the second external electrode 3b in the length direction L of the interposer main body 40. A second mounting electrode 42b is provided on the side of the second surface of the interposer main body 40. A second through conductive portion 43b is provided which penetrates the interposer main body 40 in the stacking direction T and provides electric conduction between the second joining electrode and the second mounting electrode 42b. Furthermore, the second external electrode 3b and the second joining electrode 41b are joined with each other in an electrically conductive manner by a second electrically conductive joining agent 44b which is, for example, solder for joining.

Here, a first joining region 45a shown in FIGS. 6A to 6C is a joining region between the first external electrode 3a and the first conductive joining agent 44a. The first joining region 45a extends directly above an end Pa of the first through conductive portion 43a on the side of the first surface 4a.

A second joining region 45b is a joining region between the second external electrode 3b and the second conductive joining agent 44b. The second joining region 45b extends directly above an end of the second through conductive portion 43b on the side of the second surface 4b.

It should be noted that the first joining region 45a refers to a region in which the first external electrode 3a and the first conductive joining agent 44a are in close contact with each other and electrically connected to each other, and no space is provided therebetween.

The second joining region 45b refers to a region in which the second external electrode 3b and the second conductive joining agent 44b are in close contact with each other and electrically connected to each other, and no space is provided therebetween.

The first through conductive portion 43a includes a first metal film provided on the inner wall of a first through hole 46a penetrating the interposer main body 40 in the stacking direction T. In the present preferred embodiment, the first metal film covers the entire surface of the inner wall of the first through hole 46a.

The second through conductive portion 43b includes a second metal film provided on the inner wall of a second through hole 46b penetrating the interposer main body 40 in the stacking direction T. In the present preferred embodiment, the second metal film covers the entire surface of the inner wall of the second through hole 46b.

In the first preferred embodiment, the first joining region 45a is a joining region between the first external electrode 3a and the first conductive joining agent 44a. The first joining region 45a extends directly above the end Pa at the upper end of the first through conductive portion 43a on the side of the first external electrode 3a, and further extends beyond the first through hole 46a and over the entire region directly above the first through hole 46a.

The second joining region 45b is a joining region between the second external electrode 3b and the second conductive joining agent 44b. The second joining region 45b extends directly above the end Pb at the upper end of the second through conductive portion 43b on the side of the second external electrode 3b, and further extends beyond the second through hole 46b and over the entire region directly above the second through hole 46b.

However, the present invention is not limited thereto. As shown in FIG. 6B, the first joining region 45a may cover not the entire region directly above the first through hole 46a, but only a portion thereof. The second joining region 45b may cover not the entire region directly above the second through hole 46b, but only a portion thereof.

It should be noted that, in the first preferred embodiment, as shown in FIG. 6A, the first conductive joining agent 44a, which is solder for joining, does not flow in the interior of the first through hole 46a, and the first metal film provided on the inner wall of the first through hole 46a defines and functions as the first through conductive portion 43a.

The second conductive joining agent 44b, which is solder for joining, does not flow in the interior of the second through hole 46b, and the second metal film provided on the inner wall of the second through hole 46b defines and functions as the second through conductive portion 43b.

However, the present invention is not limited thereto, and as shown in FIG. 6C, the first conductive joining agent 44a, which is solder for joining, may flow in the interior of the first through hole 46a, and thus, the first metal film provided on the inner wall of the first through hole 46a and the first conductive joining agent 44a which has flowed in may define and function as the first through conductive portion 43a.

Furthermore, the second conductive joining agent 44b, which is solder, may flow in the interior of the second through hole 46b, and thus, the second metal film provided on the inner wall of the second through hole 46b and the solder that has flowed in may define and function as the second through conductive portion 43b.

The distance x1 in the length direction L from the outer surface on the side of the first end surface Ca of the first external electrode 3a to the inner wall of the first through hole 46a is preferably within about 0.15 mm, and the distance x2 in the length direction L from the outer surface on the side of the second end surface Cb of the second outer electrode 3b to the inner wall of the second through hole 46b is preferably within about 0.15 mm, for example.

It should be noted that the stacking direction T of the internal electrode layers 15 provided in the multilayer body 2 is perpendicular or substantially perpendicular to the first surface 4a of the interposer 4.

Method of Manufacturing Multilayer Ceramic Capacitor

Figure 7:
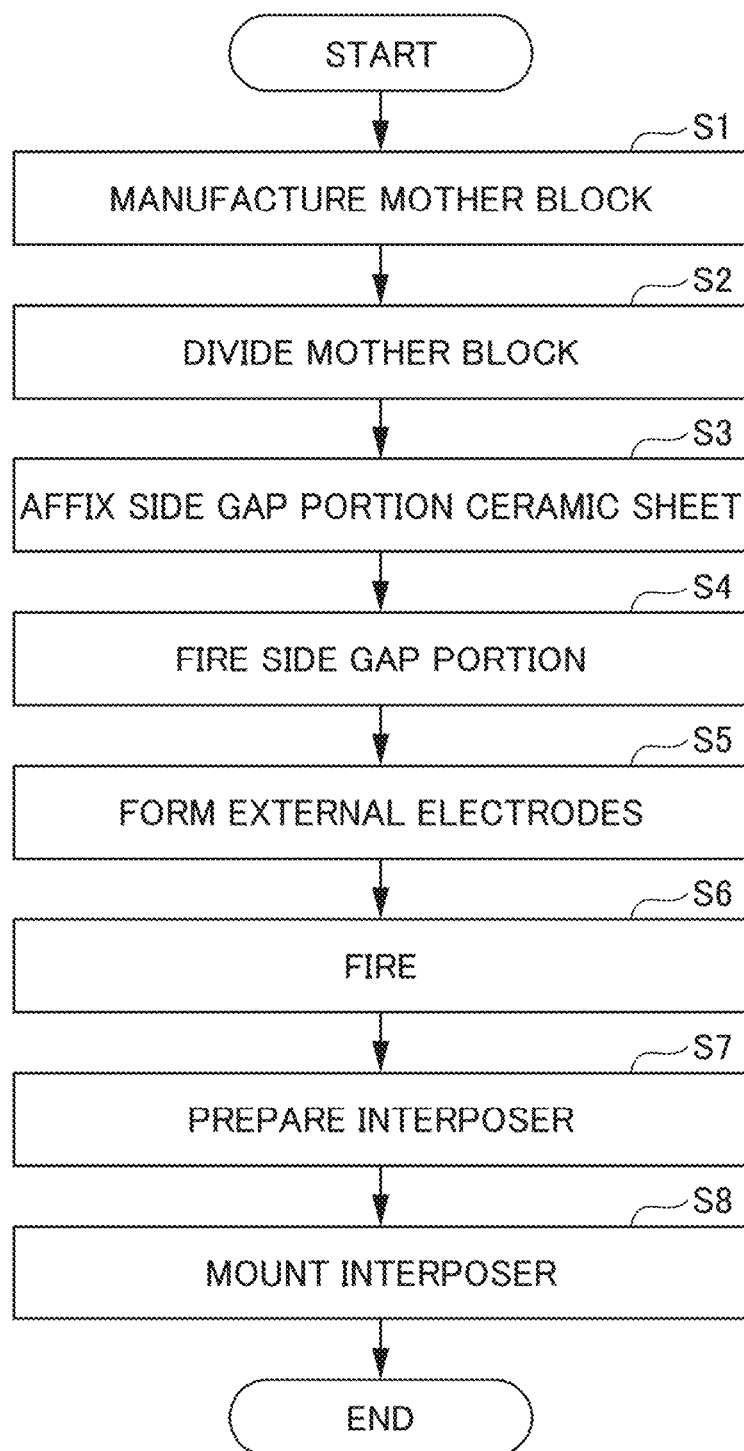
FIG. 7 is a flowchart for explaining a method of manufacturing the multilayer ceramic capacitor.
Figure 8:
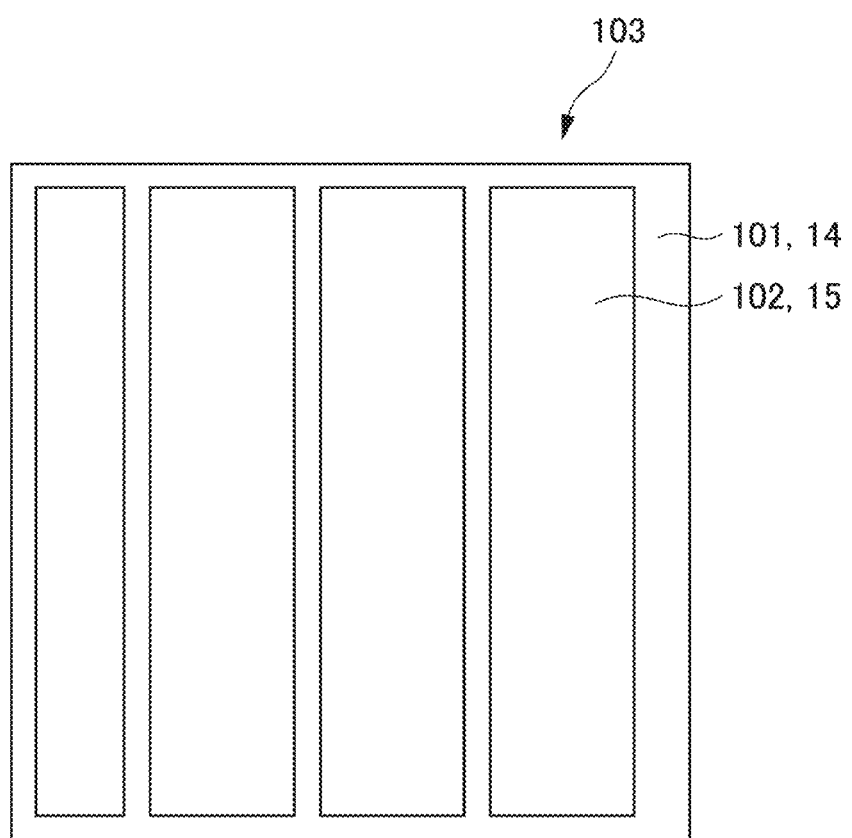
FIG. 8 is a schematic plan view of a material sheet.
Figure 9:
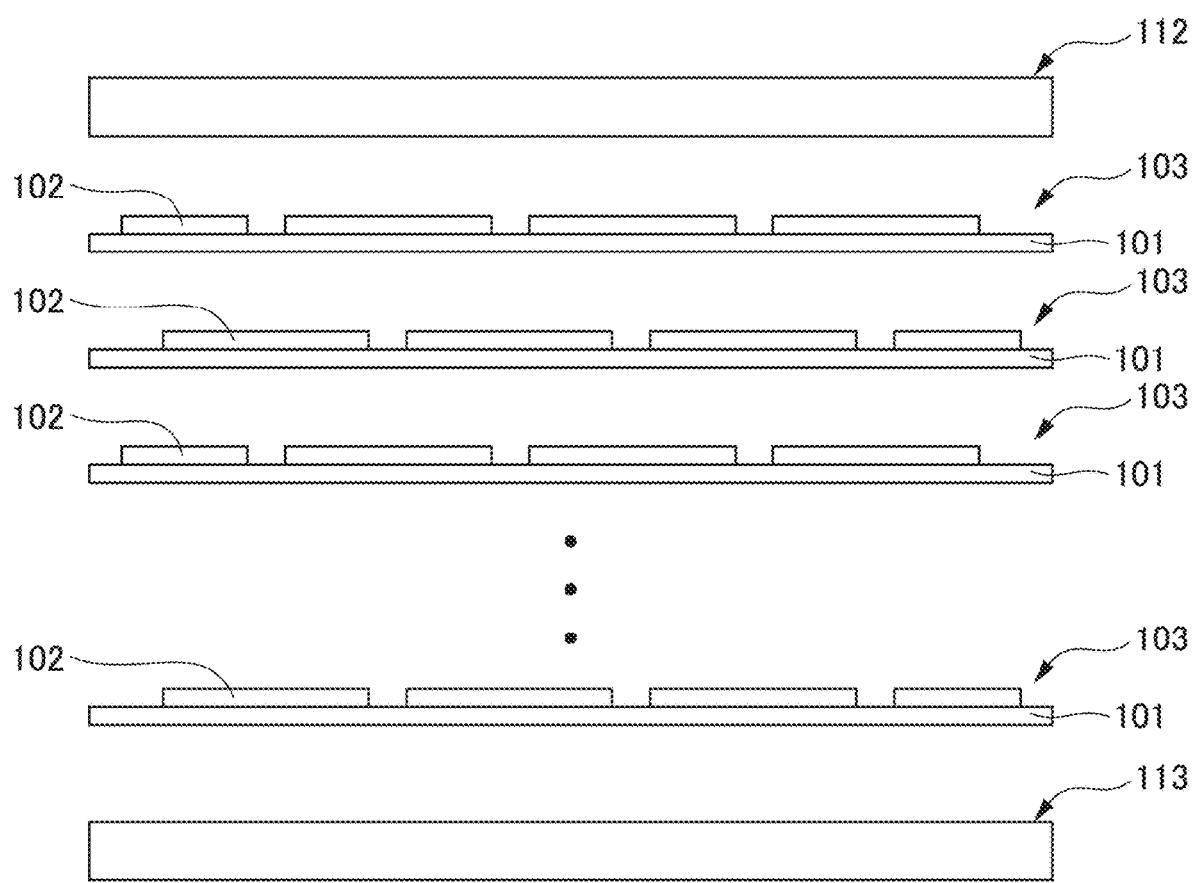
FIG. 9 is a schematic view showing a stacked state of material sheets.
Figure 10:
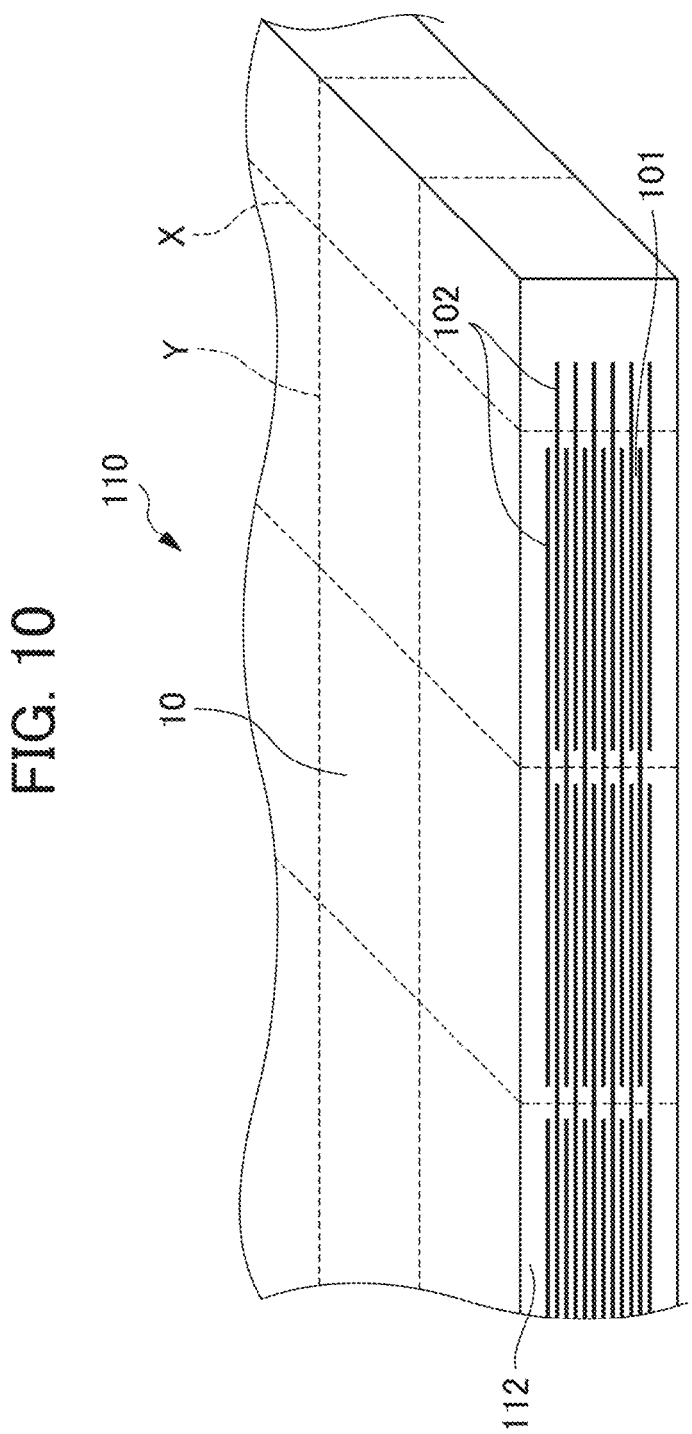
FIG. 10 is a schematic perspective view of a mother block.

FIG. 7 is a flowchart for explaining a non-limiting example of a method of manufacturing the multilayer ceramic capacitor 1. FIG. 8 is a schematic plan view of a material sheet 103. FIG. 9 is a schematic view showing a stacked state of the material sheets 103. FIG. 10 is a schematic perspective view of a mother block 110.

Mother Block Manufacturing Step S1

First, a ceramic slurry including a ceramic powder, a binder and a solvent is prepared. The ceramic slurry is formed to be in a sheet shape on a carrier film by using a die coater, gravure coater, micro gravure coater, or the like, thus manufacturing a multilayer ceramic green sheet 101.

Subsequently, the conductive paste is printed onto the multilayer ceramic green sheet 101 by screen printing, ink jet printing, gravure printing or the like, so as to have a strip-shaped pattern, thus forming a conductive pattern 102.

Thus, as shown in FIG. 8, the material sheet 103 is provided in which the conductive pattern 102 defining and functioning as the internal electrode layer 15 is printed on the surface of the multilayer ceramic green sheet 101 defining and functioning as the dielectric layer 14.

Subsequently, as shown in FIG. 9, a plurality of material sheets 103 are stacked. More specifically, the plurality of material sheets 103 are stacked such that the strip-shaped conductive patterns 102 are directed in the same direction, and the strip-shaped conductive patterns 102 are shifted by half a pitch in the width direction between the adjacent material sheets 103. Furthermore, an upper outer layer portion ceramic green sheet 112 defining and functioning as the upper outer layer portion 12a is stacked on one side of the plurality of stacked material sheet 103, while a lower outer layer portion ceramic green sheet 113 defining and functioning as the lower outer layer portion 12b is stacked on the other side thereof.

Subsequently, the upper outer layer portion ceramic green sheet 112, the plurality of stacked material sheets 103, and the lower outer layer portion ceramic green sheet 113 are subjected to thermo compression bonding. As a result, the mother block 110 shown in FIG. 10 is formed.

Mother Block Dividing Step S2

Next, as shown in FIG. 10, the mother block 110 is divided along a cutting line X and a cutting line Y intersecting the cutting line X corresponding to the dimension of the multilayer main body 10. As a result, a plurality of multilayer main body 10 shown in FIG. 5 are manufactured. It should be noted that, in the present preferred embodiment, the cutting line Y is orthogonal to the cutting line X.

Side Gap Portion Ceramic Green Sheet Affixing Step S3

Next, a ceramic slurry in which Mg is added as a sintering aid to the same dielectric powder as that of the multilayer ceramic green sheet 101 is produced. Then, a ceramic slurry is applied on the resin film, and dried to produce a side gap portion ceramic green sheet.

Then, by affixing the side gap portion ceramic green sheet on the side portion where the internal electrode layer 15 of the multilayer main body 10 is exposed, the layer is formed as the side gap portion 30. At this time, the side gap ceramic green sheet is pressed against the side portion where the internal electrode layer 15 of the multilayer main body 10 is exposed.

Side Gap Portion Firing Step S4

The multilayer main body 10 on which the layer which becomes the side gap portion 30 is provided is subjected to degreasing treatment in a nitrogen atmosphere under a predetermined condition, then fired at a predetermined temperature in a nitrogen-hydrogen-steam mixed atmosphere, and sintered to thus include the multilayer body 2.

Here, Mg of the side gap portion 30 migrates to the side of the internal electrode layer 15 during sintering. Thus, after sintering, Mg in the side gap portion 30 is segregated on the side of the internal electrode layer. Furthermore, the dielectric layer 14 and the side gap portion 30 are made of substantially the same material; however, since the side gap portion 30 is affixed to the multilayer main body 10 including the dielectric layer 14, the interface is present between the side gap portion 30 and the multilayer main body 10 even after sintering.

External Electrode Forming Step S5

Next, at both ends of the multilayer body 2, the foundation electrode layer 31, the conductive resin layer 32, and the plated layer 33 are sequentially formed to provide the external electrode 3.

Firing Step S6

Then, at a set firing temperature, heating for a predetermined time in a nitrogen atmosphere is performed. Thus, the external electrode 3 is fired on the multilayer body 2 to manufacture the capacitor main body 1A.

Interposer Preparing Step S7

The first through hole 46a and the second through hole 46b are formed in the rectangular plate material to penetrate the plate material, thus manufacturing the interposer main body 40. Then, on one side of the length direction L of the interposer main body 40, the first joining electrode 41a is formed on the first surface 4a and the first mounting electrode 42a is formed on the second surface 4b, and the first metal film as the first through conductive portion 43a is formed on the inner wall of the first through hole 46a. On the other side of the length direction L thereof, the second joining electrode 41b is formed on the first surface 4a, the second mounting electrode 42b is formed on the second surface 4b, and the second metal film as the second through conductive portion 43b is formed on the inner wall of the second through hole 46b.

Interposer Mounting Step S8

Then, the first surface 4a of the interposer main body 40 is affixed to the surface of the second main surface Ab of the capacitor main body 1A.

At this time, the first joining electrode 41a of the interposer 4 and the first external electrode 3a of the capacitor main body 1A are connected by the first conductive joining agent 44a, which is solder for joining, for example. The second joining electrode 41b of the interposer 4 and the second external electrode 3b of the capacitor main body 1A are connected by the second conductive joining agent 44b, which is solder for joining, for example.

Thus, the multilayer ceramic capacitor 1 shown in FIG. 1 is manufactured.

It should be noted that the multilayer ceramic capacitor 1 is mounted on the substrate 200 thereafter. At this time, the first mounting electrode 42a of the interposer 4 is joined to a first substrate electrode 200a provided on the substrate 200 with a first conductive mounting agent 201a, which is solder for mounting, for example. The second mounting electrode 42b is joined to a second substrate electrode 200b provided on the substrate 200 by a second conductive mounting agent 201b, which is solder for mounting, for example.

Thus, the multilayer ceramic capacitor 1 is mounted on the substrate 200. Then, electrical conduction is provided among the first external electrode 3a, the first conductive joining agent 44a, the first joining electrode 41a, the first through conductive portion 43a, the first mounting electrode 42a, and the first substrate electrode 200a. Furthermore, electrical conduction is also provided among the second external electrode 3b, the second conductive joining agent 44b, the second joining electrode 41b, the second through conductive portion 43b, the second mounting electrode 42b, and the second substrate electrode 200b.

Effects of the First Preferred Embodiment

The first preferred embodiment achieves the following effects.

In a multilayer ceramic capacitor, when the distance between the external electrode and the through conductive portion increases, the distance from the external electrode to the mounting electrode provided on the side of the substrate also increases. This can result in higher equivalent series inductance (ESL) and more loss relative to high frequency signals.

However, in the multilayer ceramic capacitor 1 of the first preferred embodiment, the first joining region 45a extends directly above the end Pa at the upper end of the first through conductive portion 43a on the side of the first external electrode 3a, and further extends beyond the first through hole 46a and over the entire region directly above the first through hole 46a.

The second joining region 45b is a joining region of the second external electrode 3b and the second conductive joining agent 44, and extends directly above the end Pb at the upper end of the second through conductive portion 43b on the side of the second external electrode 3b, and further extends beyond the second through hole 46b and over the entire region directly above the second through hole 46b.

Therefore, when electricity flows through the first conductive joining agent 44a from the first external electrode 3a to the first through conductive portion 43a, the electricity can flow through the shortest route in the first conductive joining agent 44a.

When electricity flows through the second conductive joining agent 44b from the second external electrode 3b to the second through conductive portion 43b, the electricity can flow through the shortest route in the second conductive joining agent 44b.

Therefore, according to the first preferred embodiment, it is possible to provide the multilayer ceramic capacitor 1 capable of reducing ESL.

Furthermore, it is possible to shorten the distance which electricity flows in the first external electrode 3a by setting the distance x1 in the length direction L from the outer surface on the first end surface Ca of the first external electrode 3a to the inner wall of the first through hole 46a within about 0.15 mm, for example, such that it is possible to further reduce ESL.

Similarly, it is possible to shorten the distance which electricity flows in the second external electrode 3b by setting the distance in the length direction L from the outer surface on the second end surface Cb of the second external electrode 3b to the inner wall of the second through hole 46b within about 0.15 mm, for example, such that it is possible to further reduce ESL.

Therefore, it is possible to provide the multilayer ceramic capacitor 1 capable of reducing ESL.

Second Preferred Embodiment

Next, a multilayer ceramic capacitor 1 according to a second preferred embodiment of the present invention will be described.

Figure 11A:
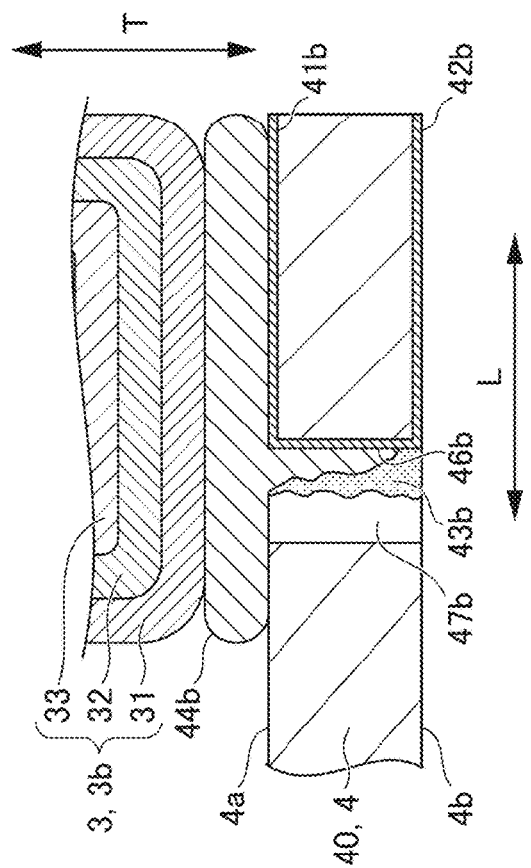
Figure 11B:
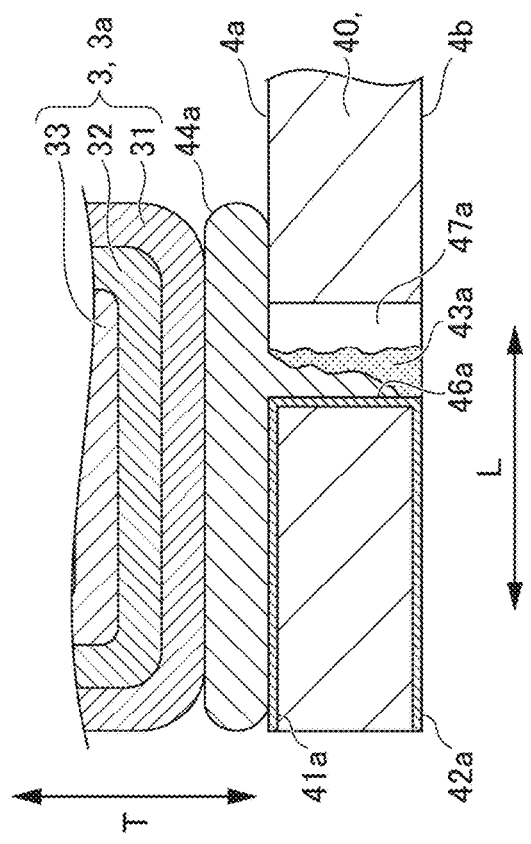

FIGS. 11A and 11B provide partially enlarged views of a multilayer ceramic capacitor 1 in a second preferred embodiment in which FIG. 11A is an enlarged view on the left side in the length direction L shown in FIG. 2, and FIG. 11B is an enlarged view on the right side in the length direction L.

The portions similar to those of the first preferred embodiment are denoted by the same reference numerals, and a description thereof is omitted.

The characteristic portions of the second preferred embodiment are as follows.

A first uncovered portion 47a which is not covered with the first metal film as the first through conductive portion 43a is provided on the side of the first surface 4a of the inner wall of the first through hole 46a. It should be noted that, in the following description, the first metal film is also denoted by reference numeral 43a.

A second uncovered portion 47b which is not covered with the second metal film as the second through conductive portion 43b is provided on the side of the first surface 4a of the inner wall of the second through hole 46b. It should be noted that, in the following description, the second metal film is also denoted by reference numeral 43b.

The first metal film 43a is provided on the inner wall of the first through hole 46a on one side in the length direction L on which the first external electrode 3a is provided, and the first uncovered portion 47a is provided on the other side in the length direction L.

The second metal film 43b is provided on the inner wall of the second through hole 46b on the other side in the length direction L on which the second external electrode 3b is provided, and the second uncovered portion 47b is provided on the one side of the length direction L.

Effects of the Second Preferred Embodiment

The second preferred embodiment achieves the following effects.

As described in the first preferred embodiment, in the interposer affixing step S8, the interposer 4 and the capacitor main body 1A are joined by the first conductive joining agent 44a, which is solder for joining, joining the first external electrode 3a and the first joining electrode 41a, and by the second conductive joining agent 44b, which is solder for joining, joining the second external electrode 3b and the second joining electrode 41b.

Here, the first conductive joining agent 44a and the second conductive joining agent 44b have higher wettability with respect to the first metal film 43a and the second metal film 43b than the first uncovered portion 47a and the second uncovered portion 47b.

Therefore, when the first conductive joining agent 44a is heated and melted at the time of joining, the first conductive joining agent 44a flows into the first through hole 46a along the first metal film 43a having high wettability. However, the first conductive joining agent 44a does not flow into the first uncovered portion 47a having low wettability. Therefore, the interior of the first through hole 46a is not completely filled with the first conductive joining agent 44a.

Furthermore, when the second conductive joining agent 44b is heated and melted at the time of joining, the second conductive joining agent 44b flows into the second through hole 46b along the second metal film 43b having high wettability. However, the second conductive joining agent 44b does not flow into the second uncovered portion 47b having low wettability. Therefore, the interior of the second through hole 46b is not completely filled with the second conductive joining agent 44b.

In such a way, a gap is provided in each of the first through hole 46a and the second through hole 46b, and the gap can be easily provided without performing a step of, for example, covering the upper portion of the first through hole 46a or the second through hole 46b.

Furthermore, in a case in which the first through hole 46a and the second through hole 46b are respectively filled with the first conductive joining agent 44a and the second conductive joining agent 44b when the multilayer ceramic capacitor 1 is mounted on the substrate 200, the first conductive mounting agent 201a and the second conductive mounting agent 201b, each of which is solder for mounting, cannot enter the first through hole 46a and the second through hole 46b, and thus, the posture at the time of mounting is not stabilized.

However, in the present preferred embodiment, the interior of the first through hole 46a or the second through hole 46b is not completely filled with the first conductive joining agent 44a or the second conductive joining agent 44b. Therefore, when the multilayer ceramic capacitor 1 is mounted on the substrate 200 by the first conductive mounting agent 201a and the second conductive mounting agent 201b, the first conductive mounting agent 201a and the second conductive mounting agent 201b can enter the first through hole 46a and the second through hole 46b, and the posture at the time of mounting is stabilized.

Furthermore, as can be seen from the cross-section shown in FIGS. 11A and 11B, the first conductive joining agent 44a and the second conductive joining agent 44b are present at the upper portions of the first through hole 46a and the second through hole 46b. However, at the upper portions of the first through hole 46a and the second through hole 46b, there is a portion in which the first conductive joining agent 44a or the second conductive joining agent 44b is not present in a portion other than the cross section shown in FIGS. 11A and 11B.

Therefore, an air hole (not shown) leading from the second surface 4b to the first surface 4a is present in the first through hole 46a and the second through hole 46b. The air hole is a hole through which air can pass. Therefore, when the multilayer ceramic capacitor 1 is mounted on the substrate 200, air between the first conductive mounting agent 201a and the second conductive mounting agent 201b, and the multilayer ceramic capacitor 1 can pass through a portion (i.e., an air hole) of each of the first through hole 46a and the second through hole 46b which is not filled with the first conductive joining agent 44a or the second conductive joining agent 44b, and escape to the side of the first surface 4a of the interposer 4.

Therefore, allowing the air to escape as above also stabilizes the posture when the multilayer ceramic capacitor 1 is mounted on the substrate 200 with the first conductive mounting agent 201a and the second conductive mounting agent 201b.

On the other hand, in a case in which the first conductive joining agent 44a and the second conductive joining agent 44b do not flow at all to the first through hole 46a and the second through hole 46b at the time of joining the capacitor main body 1A and the interposer 4, the joining force between the capacitor main body 1A and the interposer 4 is weakened.

However, in the second preferred embodiment, the first conductive joining agent 44a and the second conductive joining agent 44b partially flow into the first through hole 46a and the second through hole 46b along the first metal film 43a and the second metal film 43b. Therefore, strong joining between the capacitor main body 1A and the interposer 4 is ensured.

Modification

Figure 13:
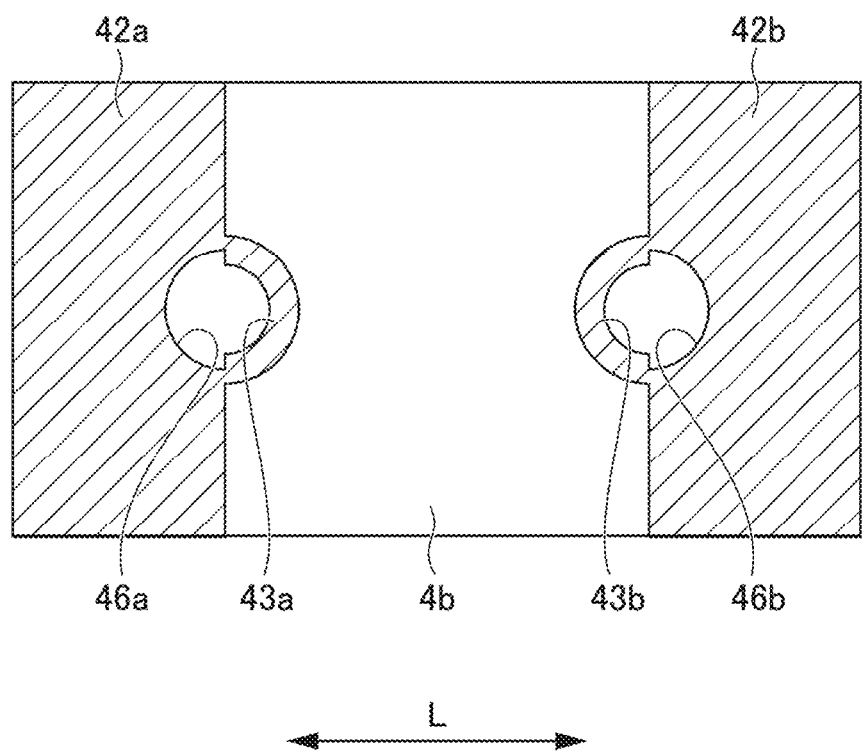
FIG. 13 is a view of the multilayer ceramic capacitor of the modification of the second preferred embodiment of the present invention seen from a side of the second surface.

FIGS. 12A and 12B provide partially enlarged views of the multilayer ceramic capacitor in a modification of the second preferred embodiment in which FIG. 12A is one portion in the length direction, and FIG. 12B is the other portion in the length direction. FIG. 13 is a view of the multilayer ceramic capacitor of the modification of the second preferred embodiment seen from a side of the second surface 4b.

The modification of the multilayer ceramic capacitor 1 of the second preferred embodiment is different from the above-described preferred embodiment in that the first metal film 43a is provided on the other side in the length direction L of the inner wall of the first through hole 46a and the first uncovered portion 47a is provided on the one side in the length direction L of the inner wall of the first through hole 46a, and the second metal film 43b is provided on the other side in the length direction L of the inner wall of the second through hole 46b and the second uncovered portion 47b is provided on the one side in the length direction L of the inner wall of the second through hole 46b.

As shown in FIG. 13, in the modification, the first metal film 43a provided on the other side of the first through hole 46a is connected to the first mounting electrode 42a by the first mounting electrode 42a extending to the other side of the first through hole 46a on the side of the second surface 4b. The same applies to the connection between the first metal film 43a and the first joining electrode 41a on the side of the first surface 4a.

The second metal film 43b provided on the one side of the second through holes 46b is connected to the second mounting electrode 42b by the second mounting electrode 42b extending to the other side of the second through hole 46b on the side of the second surface 4b. The same applies to the connection between the second metal film 43b and the second joining electrode 41b on the side of the first surface 4a. Since the rest is the same as that of the above-described second preferred embodiment, description thereof is omitted.

The modification of the second preferred embodiment also achieves the same effects as the above-described second preferred embodiment.

Third Preferred Embodiment

Next, a multilayer ceramic capacitor 1 according to a third preferred embodiment of the present invention will be described.

Figure 14A:
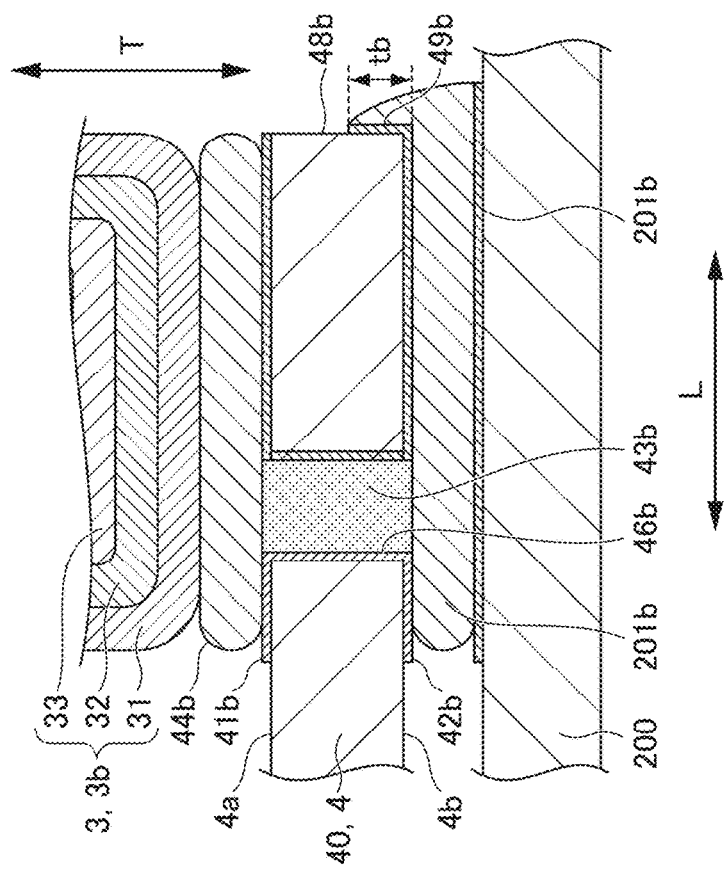
Figure 14B:
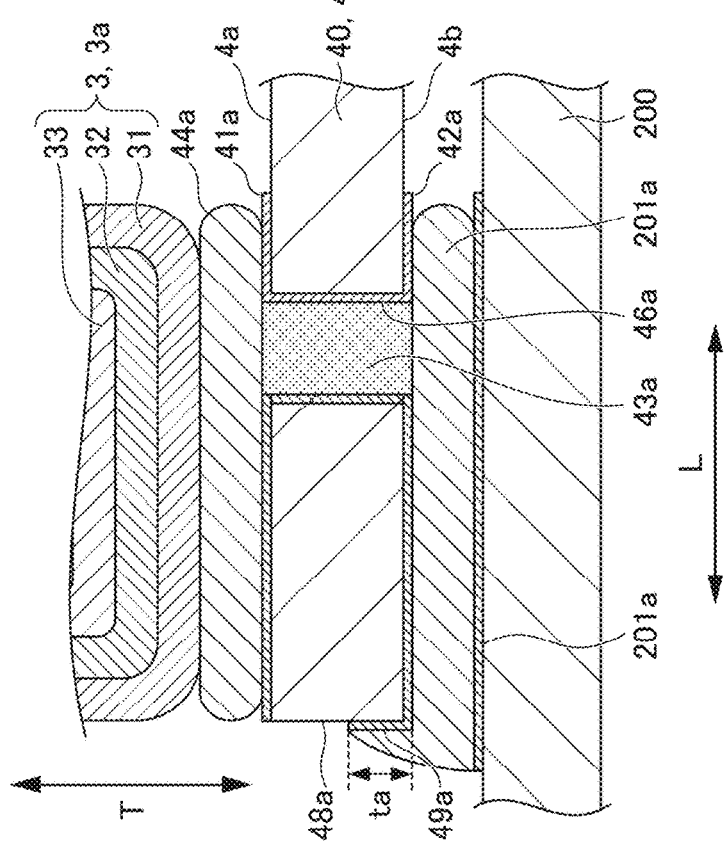

FIGS. 14A and 14B provide partially enlarged views of a state in which a multilayer ceramic capacitor of a third preferred embodiment is mounted on the substrate 200 in which FIG. 14A is an enlarged view on the left side in the length direction L, and FIG. 14B is an enlarged view on the right side in the length direction L.

The portions similar to those of the first preferred embodiment are denoted by the same reference numerals, and descriptions thereof are omitted.

The characteristic portions of the third preferred embodiment are as follows.

The first mounting electrode 42a includes a first portion 49a covering the lower portion of a first interposer end surface 48a on one side in the length direction L of the interposer 4, and the second mounting electrode 42b includes a second portion 49b covering the lower portion of a second interposer end surface 48b on the other side in the length direction L of the interposer 4.

The length ta of the first portion 49a in the stacking direction T is preferably less than half the thickness of the interposer 4, and the length tb of the second portion 49b in the stacking direction T is preferably less than half the thickness of the interposer 4.

For example, in a case in which the thickness of the interposer 4 is about 1.0 mm or less, the length ta of the first portion 49a in the stacking direction T is preferably about 0.3 mm or less, and the length tb of the second portion 49b in the stacking direction T is preferably about 0.3 mm or less.

In a case in which the thickness of the interposer 4 is about 0.5 mm or less, the length ta of the first portion 49a in the stacking direction T is preferably about 0.16 mm or less, and the length tb of the second portion 49b in the stacking direction T is preferably about 0.16 mm or less, for example.

In a case in which the thickness of the interposer 4 is about 0.2 mm or less, the length ta of the first portion 49a in the stacking direction T is preferably about 0.06 mm or less, and the length tb of the second portion 49b in the stacking direction T is preferably about 0.06 mm or less, for example.

In a case in which the thickness of the interposer 4 is about 0.1 mm or less, the length ta of the first portion 49a in the stacking direction T is preferably about 0.03 mm or less, and the length tb of the second portion 49b in the stacking direction T is preferably about 0.03 mm or less, for example.

Effects of the Third Preferred Embodiment

The third preferred embodiment achieves the following effects.

When the multilayer ceramic capacitor 1 is joined to the substrate 200, the first conductive mounting agent 201a, which is solder for mounting, for example, is provided on the first substrate electrode 200a provided on the substrate 200, and the second conductive mounting agent 201b, which is solder for mounting, for example, is provided on the second substrate electrode 200b provided on the substrate 200.

Then, the first conductive mounting agent 201a and the second conductive mounting agent 201b are melted by heating the substrate 200.

The multilayer ceramic capacitor 1 is mounted such that the interposer 4 is provided on the substrate 200 in a state in which the first conductive mounting agent 201a and the second conductive mounting agent 201b are melted so that the first mounting electrode 42a is above the first conductive mounting agent 201a and the second mounting electrode 42b is above the second conductive mounting agent 201b.

Here, the first mounting electrode 42a includes the first portion 49a covering the lower portion of the first interposer end surface 48a. Therefore, as shown in FIGS. 14A and 14B, the first conductive mounting agent 201a extends around the first portion 49a of the first interposer end surface 48a at the time of mounting.

On the other hand, the second mounting electrode 42b includes the second portion 49b covering the lower portion of the second interposer end surface 48b. Therefore, as shown in FIGS. 14A and 14B, the second conductive mounting agent 201b extends around the second portion 49b of the second interposer end surface 48b at the time of mounting.

As a result, in the interposer 4, the first interposer end surface 48a and the second interposer end surface 48b, which are both end surfaces in the length direction L, are pulled from both ends by the surface tension of the first conductive mounting agent 201a and the surface tension of the second conductive mounting agent 201b. Therefore, the interposer 4, i.e., the multilayer ceramic capacitor 1, is aligned in the length direction L, and thus, it is possible to stabilize the posture at the time of mounting.

Fourth Preferred Embodiment

Next, a multilayer ceramic capacitor 1 according to a fourth preferred embodiment of the present invention will be described.

FIGS. 15A and 15B provide partially enlarged views of a multilayer ceramic capacitor 1 of a fourth preferred embodiment in which FIG. 15A is an enlarged view on the left side in the length direction L, and FIG. 15B is an enlarged view on the right side in the length direction L.

The portions similar to those of the first preferred embodiment and the third preferred embodiment are denoted by the same reference numerals, and descriptions thereof are omitted.

The characteristic portions of the fourth preferred embodiment are as follows.

The first joining electrode 41a includes a first portion 50a covering the upper portion of the first interposer end surface 48a on one side in the length direction L of the interposer 4, and the second joining electrode 41b has a second portion 50b covering the upper portion of the second interposer end surface 48b on the other side in the length direction L of the interposer 4.

The length s1 of the first portion 50a in the stacking direction T is preferably less than half the thickness of the interposer 4, and the length s2 of the second portion 50b in the stacking direction T is preferably less than half the thickness of the interposer 4.

For example, in a case in which the thickness of the interposer 4 is about 1.0 mm or less, the length s1 in the stacking direction T of the first portion 50a is preferably about 0.3 mm or less, and the length s2 in the stacking direction T of the second portion 50b is preferably about 0.3 mm or less, for example.

In a case in which the thickness of the interposer 4 is about 0.5 mm or less, the length s1 of the first portion 50a in the stacking direction T is preferably about 0.16 mm or less, and the length s2 of the second portion 50b in the stacking direction T is preferably about 0.16 mm or less, for example.

In a case in which the thickness of the interposer 4 is about 0.2 mm or less, the length s1 of the first portion 50a in the stacking direction T is preferably about 0.06 mm or less, and the length s2 of the second portion 50b in the stacking direction T is preferably about 0.06 mm or less, for example.

In a case in which the thickness of the interposer 4 is about 0.1 mm or less, the length s1 of the first portion 50a in the stacking direction T is preferably about 0.03 mm or less, and the length s2 of the second portion 50b in the stacking direction T is preferably about 0.03 mm or less, for example.

Effects of the Fourth Preferred Embodiment

The fourth preferred embodiment achieves the following effects.

When the interposer 4 is joined to the capacitor main body 1A, the first conductive joining agent 44a, which is solder for joining, is provided on the first joining electrode 41a provided on the interposer 4, for example, and the second conductive joining agent 44b, which is solder for joining, is provided on the second joining electrode 41b provided on the interposer 4, for example.

Then, the first conductive joining agent 44a and the second conductive joining agent 44b are melted by heating the interposer 4.

The capacitor main body 1A is joined on the interposer such that the capacitor main body 1A is provided on the interposer 4 in a state where the first conductive joining agent 44a and the second conductive joining agent 44b are melted, so that the first external electrode 3a is on the first conductive joining agent 44a, and the second external electrode 3b is on the second conductive joining agent 44b.

Here, the first joining electrode 41a includes the first portion 50a covering the upper portion of the first interposer end surface 48a. Therefore, at the time of joining as shown in FIGS. 15A and 15B, the first conductive joining agent 44a extends around the first portion 50a of the first interposer end surface 48a.

The second joining electrode 41b includes the second portion 50b covering the upper portion of the second interposer end surface 48b. Therefore, at the time of joining as shown in FIGS. 15A and 15B, the second conductive joining agent 44b extends around the second portion 50b of the second interposer end surface 48b.

As a result, in the interposer 4, the first interposer end surface 48a and the second interposer end surface 48b, which are both end surfaces in the length direction L, are pulled from both ends by the surface tension of the first conductive joining agent 44a and the surface tension of the second conductive joining agent 44b. Therefore, the interposer 4 is aligned in the length direction L, and thus, it is possible to stabilize the posture with respect to the capacitor main body 1A.

Furthermore, in a case in which the first joining electrode 41a does not extend to the lower portion of the first interposer end surface 48a, the first conductive mounting agent 201a does not reach the first interposer end surface 48a when the multilayer ceramic capacitor 1 is mounted on the substrate 200. Therefore, it is difficult to form a so-called fillet in which the first conductive mounting agent 201a is raised.

Likewise, in a case in which the second joining electrode 41b does not extend to the lower portion of the second interposer end surface 48b, the second conductive mounting agent 201b does not reach the second interposer end surface 48b when the multilayer ceramic capacitor 1 is mounted on the substrate 200. Therefore, it is difficult to form a so-called fillet in which the second conductive mounting agent 201b is raised.

Fifth Preferred Embodiment

Next, a multilayer ceramic capacitor 1 according to a fifth preferred embodiment of the present invention will be described.

FIGS. 16A and 16B are partially enlarged views of a multilayer ceramic capacitor 1 of a fifth preferred embodiment in which FIG. 16A is an enlarged view on the left side in the length direction L, and FIG. 16B is an enlarged view on the right side in the length direction L.

The portions similar to those of the first preferred embodiment are denoted by the same reference numerals, and a description thereof is omitted.

The characteristic portions of the fifth preferred embodiment are as follows.

The inner wall of the first through hole 46a is covered with the first metal film 43a, the side of the first surface 4a of the first through hole 46a is filled with the first conductive joining agent 44a, which is, for example, solder for joining, and the first conductive joining agent 44a includes a portion having a center which is recessed in a mortar shape when the first through hole 46a is viewed from the second surface 4b toward the side of the first surface 4a.

The inner wall of the second through hole 46b is covered with the second metal film 43b, the side of the first surface 4a of the second through hole 46b is filled with the second conductive joining agent 44b, which is, for example, solder for joining, and the second conductive joining agent 44b includes a portion having a center which is recessed in a mortar shape when the second through hole 46b is viewed from the second surface 4b toward the side of the first surface 4a.

Furthermore, an edge 51a of the first conductive joining agent 44a flowing into the first through hole 46a on the inner wall of the first through hole 46a is preferably located closer to the side of the first surface 4a than the half of the thickness of the interposer 4. Furthermore, the edge 51a is more preferably located closer to the side of the first surface 4a than one third of the thickness of the interposer 4.

An edge 51b of the second conductive joining agent 44b flowing into the second through hole 46b on the inner wall of the second through hole 46b is preferably located closer to the side of the first surface 4a than the half of the thickness of the interposer 4. Furthermore, the edge 51b is more preferably located closer to the side of the first surface 4a than one third of the thickness of the interposer 4.

It should be noted that the thickness of the interposer 4 is, for example, about 1.0 mm or less, about 0.5 mm or less, about 0.2 mm or less, or about 0.1 mm or less.

In the fifth preferred embodiment, in order for the portion having the center in each of the first conductive joining agent 44a and the second conductive joining agent 44b to be recessed when viewed from the second surface 4b toward the side of the first surface 4a, the interposer affixing step S8 is performed as follows, for example. However, the present invention is not limited thereto, and may be done by another method.

First, the first conductive joining agent 44a and the second conductive joining agent 44b, which are each solder for joining, for example, are provided on the first joining electrode 41a and the second joining electrode 41b. At this time, the first conductive joining agent 44a and the second conductive joining agent 44b are provided on the upper portions of the first through holes 46a and the second through holes 46b, respectively, in a larger amount than the other portions.

It should be noted that wettability of the first conductive joining agent 44a with respect to the first metal film 43a, and wettability of the second conductive joining agent 44b with respect to the second metal film 43b are preferably increased by providing a thin solder film in advance on the surfaces of the first metal film 43a of the inner wall of the first through hole 46a and the second metal film 43b of the inner wall of the second through hole 46b, or performing other surface processing.

Then, the first conductive joining agent 44a and the second conductive joining agent 44b are melted by heating the interposer 4.

At this time, since the first conductive joining agent 44a and the second conductive joining agent 44b are provided in a larger amount on the upper portion of the first through hole 46a and the second through hole 46b than the other portions, the first conductive joining agent 44a and the second conductive joining agent 44b flow onto the sides of the first mounting electrode 42a and the second mounting electrode 42b below, along the surfaces of the first metal film 43a and the second metal film 43b.

Here, the heating time and temperature are adjusted so that the first conductive joining agent 44a and the second conductive joining agent 44b respectively flow out to the side of the first mounting electrode 42a and to the side of the second mounting electrode 42b below, but do not completely fill the first through hole 46a and the second through hole 46b, and the portion having the center in each of the first conductive joining agent 44a and the second conductive joining agent 44b is recessed when viewed from the second surface 4b toward the side of the first surface 4a.

The capacitor main body 1A is joined on the interposer such that the capacitor main body 1A is provided on the interposer 4 in a state where the first conductive joining agent 44a and the second conductive joining agent 44b are melted, so that the first external electrode 3a is on the first conductive joining agent 44a, and the second external electrode 3b is on the second conductive joining agent 44b.

In this way, the portion having the center of each of the first conductive joining agent 44a and the second conductive joining agent 44b is provided so as to appear recessed when viewed from the second surface 4b to the side of the first surface 4a.

Effects of the Fifth Preferred Embodiment

According to the fifth preferred embodiment, a gap is provided in each of the first through hole 46a and the second through hole 46b, and the gap can be easily provided without performing a step of, for example, covering the upper portion of the first through hole 46a or the second through hole 46b.

Furthermore, when the multilayer ceramic capacitor 1 is mounted on the substrate 200, the first mounting electrode 42a of the interposer 4 is joined to the first substrate electrode 200a provided on the substrate 200 with, for example, the first conductive mounting agent 201a, which is solder for mounting. The second mounting electrode 42b is joined to the second substrate electrode 200b provided on the substrate 200, for example, by the second conductive mounting agent 201b, which is solder for mounting.

Here, in the fifth preferred embodiment, the first conductive joining agent 44a is present on the upper portion of the first through hole 46a, and the portion having a center of the first conductive joining agent 44a is recessed in a mortar shape, for example, when the first through hole 46a is viewed from the second surface 4b to the side of the first surface 4a.

The second conductive joining agent 44b is present on the upper portion of the second through hole 46b, and the portion having a center of the second conductive joining agent 44b is recessed in a mortar shape, for example, when the second through hole 46b is viewed from the second surface 4b to the side of the first surface 4a.

That is, the interiors of the first through hole 46a and the second through hole 46b are not completely filled with the first conductive joining agent 44a and the second conductive joining agent 44b, respectively, and thus gaps are provided. Therefore, when the multilayer ceramic capacitor 1 is mounted on the substrate 200 by the first conductive mounting agent 201a and the second conductive mounting agent 201b, it is possible for the first conductive mounting agent 201a and the second conductive mounting agent 201b to enter the gap between the first through hole 46a and the second through hole 46b, and the posture at the time of mounting is stabilized.

Furthermore, the surface on the side of the second surface 4b in the first through hole 46a of the first conductive joining agent 44a includes the portion having the recessed center, and thus includes a larger area than when the center is flat. The surface on the side of the second surface 4b in the second through hole 46b of the second conductive joining agent 44b includes the portion having the recessed center, and thus includes a larger area than when the center is flat.

Therefore, since the contact area between the first conductive mounting agent 201a and the second conductive mounting agent 201b, and the first conductive joining agent 44a and the second conductive joining agent 44b becomes large, the joining force between the first conductive mounting agent 201a and the second conductive mounting agent 201b, and the first conductive joining agent 44a and the second conductive joining agent 44b can be increased.

Although the first preferred embodiment to the fifth preferred embodiment of the present invention have been described above, the present invention is not intended to be limited to the preferred embodiments, and various modifications can be made within the scope of the gist thereof.

For example, in the above-described preferred embodiment shown in FIG. 3, in the width direction W, the interposer 4 is substantially the same size as the outer electrode 3 in the width direction W; however, the present invention is not limited thereto. That is, in the width direction W, the interposer 4 may be smaller than the outer electrode 3 in the width direction W. For example, in the width direction W, the interposer 4 may be narrower than the widest portion of the internal electrode layer 15 in the width direction W by, for example, about 10 μm.

Furthermore, a description is provided of a preferred embodiment with a configuration in which one interposer 4 is affixed to the capacitor main body 1A; however, the present invention is not limited thereto. For example, the interposer 4 may be configured as a two-way dividing interposer, for example, including a first interposer portion including a joining electrode connected to the first external electrode 3a, and a second interposer portion that is spaced apart from the first interposer portion and includes a joining electrode connected to the second external electrode 3b.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
   a capacitor main body; and
   an interposer;
   the capacitor main body including:
   a multilayer body including dielectric layers and internal electrode layers alternately stacked, a first main surface on one side and a second main surface on the other side in a stacking direction, and a first end surface on one side and a second end surface on the other side in a length direction intersecting the stacking direction;
   a first external electrode provided on the first end surface of the multilayer body and extending from the first end surface to a portion of the first main surface and a portion of the second main surface; and
   a second external electrode provided on the second end surface of the multilayer body and extending from the second end surface to a portion of the first main surface and a portion of the second main surface;
   the interposer being at or adjacent to the second main surface of the capacitor main body, and including a first surface facing the second main surface, and a second surface opposite to the first surface; wherein
   the interposer includes, on a side of the first external electrode in the length direction:
   a first joining electrode on the first surface;
   a first mounting electrode on the second surface; and
   a first through hole that penetrates the interposer in the stacking direction, and provides electrical conduction between the first joining electrode and the first mounting electrode, the first through hole further including a first metal film provided on an inner wall thereof; and
   the interposer includes, on a side of the second external electrode in the length direction:
   a second joining electrode on the first surface;
   a second mounting electrode on the second surface;
   a second through hole that penetrates the interposer in the stacking direction, and provides electrical conduction between the second joining electrode and the second mounting electrode, the second through hole further including a second metal film provided on an inner wall thereof;
   the inner wall of the first through hole includes a first uncovered portion, which is not covered by the first metal film, on a side of the inner wall of the first through hole closest to the first surface; and
   the inner wall of the second through hole includes a second uncovered portion, which is not covered by the second metal film, on a side of the inner wall of the second through hole closest to the first surface.

2. The multilayer ceramic capacitor according to claim 1, wherein
   on the inner wall of the first through hole, the first metal film is provided on the one side in the length direction, and the first uncovered portion is provided on the other side in the length direction; and
   on the inner wall of the second through hole, the second metal film is provided on the other side in the length direction, and the second uncovered portion is provided on the one side in the length direction.

3. The multilayer ceramic capacitor according to claim 1, wherein
   on the inner wall of the first through hole, the first metal film is provided on the other side in the length direction, and the first uncovered portion is provided on the one side in the length direction; and
   on the inner wall of the second through hole, the second metal film is provided on the one side in the length direction, and the second uncovered portion is provided on the other side in the length direction.

4. The multilayer ceramic capacitor according to claim 1, wherein a distance in the length direction from an outer surface of the first end surface of the first external electrode to the inner wall of the first through hole is within 0.15 mm; and a distance in the length direction from an outer surface of the second end surface of the second external electrode to the inner wall of the second through hole is within 0.15 mm.

5. The multilayer ceramic capacitor according to claim 1, wherein a stacking direction of the internal electrode layers in the multilayer body is perpendicular to the first surface of the interposer.

6. The multilayer ceramic capacitor according to claim 1, wherein the capacitor main body has a rectangular shape.

7. The multilayer ceramic capacitor according to claim 1, wherein the capacitor main body is rounded at a corner or a ridge.

8. The multilayer ceramic capacitor according to claim 1, wherein the capacitor main body has a dimension in the length direction of 0.2 mm or more and 10 mm or less, a dimension in the width direction of 0.1 mm or more and 10 mm or less, and a dimension in the stacking direction of 0.1 mm or more and 5 mm or less.

9. The multilayer ceramic capacitor according to claim 1, wherein the capacitor main body includes a side gap portion.

10. The multilayer ceramic capacitor according to claim 9, wherein the side gap portion includes an outer side gap layer and an inner side gap layer.

11. The multilayer ceramic capacitor according to claim 10, wherein the outer side gap layer has a content of Si greater than that of the inner side gap layer.

12. The multilayer ceramic capacitor according to claim 1, wherein the interposer is a single plate including resin.

13. The multilayer ceramic capacitor according to claim 1, further comprising:
   a first joining region that joins the first external electrode and a first conductive joining agent extends directly above an end at an upper end of a first through conductive portion on the side of the first external electrode; and
   a second joining region that joins the second external electrode and a second conductive joining agent extends directly above an end at an upper end of a second through conductive portion on the side of the second external electrode.

14. The multilayer ceramic capacitor according to claim 13, wherein the interposer and the capacitor main body are joined by the first conductive joining agent and by the second conductive joining agent.

15. The multilayer ceramic capacitor according to claim 13, wherein each of the first conductive joining agent and the second conductive joining agent include solder.

16. The multilayer ceramic capacitor according to claim 13, wherein the first conductive joining agent and the second conductive joining agent have higher wettability with respect to the first metal film and the second metal film than the first uncovered portion and the second uncovered portion.

17. The multilayer ceramic capacitor according to claim 13, wherein the first through hole is not completely filled with the first conductive joining agent.

18. The multilayer ceramic capacitor according to claim 13, wherein the second through hole is not completely filled with the second conductive joining agent.

19. The multilayer ceramic capacitor according to claim 13, wherein the first conductive joining agent and the second conductive joining agent are present at upper portions of the first through hole and the second through hole.

20. The multilayer ceramic capacitor according to claim 13, wherein an air hole extends between the first through hole and the second through hole.

* * * * *